US012577466B2

(12) United States Patent
Dictus et al.

(10) Patent No.: US 12,577,466 B2
(45) Date of Patent: Mar. 17, 2026

(54) PHOTORESIST DEVELOPMENT WITH ORGANIC VAPOR

(71) Applicant: Lam Research Corporation, Fremont, CA (US)

(72) Inventors: Dries Dictus, Kessel-Lo (BE); Chenghao Wu, San Jose, CA (US); Eric Calvin Hansen, San Jose, CA (US); Timothy William Weidman, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 172 days.

(21) Appl. No.: 18/254,787

(22) PCT Filed: Dec. 3, 2021

(86) PCT No.: PCT/US2021/061751
§ 371 (c)(1),
(2) Date: May 26, 2023

(87) PCT Pub. No.: WO2022/125388
PCT Pub. Date: Jun. 16, 2022

(65) Prior Publication Data
US 2023/0416606 A1     Dec. 28, 2023

Related U.S. Application Data

(60) Provisional application No. 63/199,129, filed on Dec. 8, 2020.

(51) Int. Cl.
*C09K 13/08* (2006.01)
*G03F 7/004* (2006.01)
(Continued)

(52) U.S. Cl.
CPC ............ *C09K 13/08* (2013.01); *G03F 7/0042* (2013.01); *G03F 7/36* (2013.01); *H01L 21/0337* (2013.01)

(58) Field of Classification Search
None
See application file for complete search history.

(56) References Cited

U.S. PATENT DOCUMENTS

| | | |
|---|---|---|
| 3,442,648 A | 5/1969 | Smith et al. |
| 3,513,010 A | 5/1970 | Notley et al. |

(Continued)

FOREIGN PATENT DOCUMENTS

| | | |
|---|---|---|
| CN | 1841201 A | 10/2006 |
| CN | 102027577 A | 4/2011 |

(Continued)

OTHER PUBLICATIONS

CN Office Action dated Apr. 22, 2024 in CN Application No. 201980085227.1 with English translation.

(Continued)

*Primary Examiner* — Allan W. Olsen
(74) *Attorney, Agent, or Firm* — Weaver Austin Villeneuve & Sampson LLP

(57) ABSTRACT

Development of resists are useful, for example, to form a patterning mask in the context of high-resolution patterning. Development can be accomplished using an organic vapor such as a carboxylic acid. In some implementations, the organic vapor is trifluoroacetic acid. In some implementations, the organic vapor is hexafluoro-acetylacetone. A metal-containing resist film such as an EUV-sensitive organo-metal oxide may be deposited on a semiconductor substrate using a dry or wet deposition technique. The metal-containing resist film on the semiconductor substrate may be developed using the organic vapor, or residue of (Continued)

Provide in a process chamber a photopatterned metal-containing resist on a surface of a semiconductor substrate — 202

Dry develop the photopatterned metal-containing resist by selectively removing a portion of the resist by exposure to a dry development chemistry comprising an organic vapor to form a resist mask — 204

200 metal-containing resist material formed on surfaces of a process chamber may be removed using the organic vapor.

9 Claims, 12 Drawing Sheets

(51) Int. Cl.
　　*G03F 7/36* 　　　(2006.01)
　　*H01L 21/033* 　(2006.01)

(56) References Cited

U.S. PATENT DOCUMENTS

| | | | |
|---|---|---|---|
| 3,529,963 A | 9/1970 | Marchese et al. | |
| 3,576,755 A | 4/1971 | Patella et al. | |
| 3,720,515 A | 3/1973 | Stanley | |
| 4,061,829 A | 12/1977 | Taylor | |
| 4,241,165 A | 12/1980 | Hughes et al. | |
| 4,292,384 A | 9/1981 | Straughan et al. | |
| 4,314,022 A | 2/1982 | Fisch | |
| 4,328,298 A | 5/1982 | Nester | |
| 4,341,592 A | 7/1982 | Shortes et al. | |
| 4,396,704 A | 8/1983 | Taylor | |
| 4,590,149 A | 5/1986 | Nakane et al. | |
| 4,738,748 A | 4/1988 | Kisa | |
| 4,806,456 A | 2/1989 | Katoh | |
| 4,814,243 A | 3/1989 | Ziger | |
| 4,834,834 A | 5/1989 | Ehrlich et al. | |
| 4,842,989 A | 6/1989 | Taniguchi et al. | |
| 4,845,053 A | 7/1989 | Zajac | |
| 4,940,854 A | 7/1990 | Debe | |
| 5,077,085 A | 12/1991 | Schnur et al. | |
| 5,094,936 A | 3/1992 | Misium et al. | |
| 5,206,706 A | 4/1993 | Quinn | |
| 5,322,765 A | 6/1994 | Clecak et al. | |
| 5,445,988 A | 8/1995 | Schwalke | |
| 5,534,312 A | 7/1996 | Hill et al. | |
| 5,683,857 A * | 11/1997 | Shirai ................... G03F 7/0758 430/311 | |
| 5,914,278 A | 6/1999 | Boitnott et al. | |
| 5,925,494 A | 7/1999 | Horn | |
| 6,013,418 A | 1/2000 | Ma et al. | |
| 6,017,553 A | 1/2000 | Burrell et al. | |
| 6,045,877 A | 4/2000 | Gleason et al. | |
| 6,162,577 A | 12/2000 | Felter et al. | |
| 6,179,922 B1 | 1/2001 | Ishikawa et al. | |
| 6,179,924 B1 | 1/2001 | Zhao et al. | |
| 6,183,934 B1 | 2/2001 | Kawamonzen | |
| 6,261,938 B1 | 7/2001 | Beauvais et al. | |
| 6,290,779 B1 | 9/2001 | Saleh et al. | |
| 6,319,654 B1 | 11/2001 | Kim et al. | |
| 6,348,239 B1 | 2/2002 | Hill et al. | |
| 6,448,097 B1 | 9/2002 | Singh et al. | |
| 6,566,276 B2 | 5/2003 | Maloney et al. | |
| 6,573,030 B1 | 6/2003 | Fairbairn et al. | |
| 6,607,867 B1 | 8/2003 | Kim et al. | |
| 6,666,986 B1 | 12/2003 | Vaartstra | |
| 6,797,439 B1 | 9/2004 | Alpay | |
| 6,841,341 B2 | 1/2005 | Fairbairn et al. | |
| 6,841,943 B2 | 1/2005 | Vahedi et al. | |
| 6,867,086 B1 | 3/2005 | Chen et al. | |
| 7,112,489 B1 | 9/2006 | Lyons et al. | |
| 7,169,440 B2 | 1/2007 | Balasubramaniam et al. | |
| 7,223,526 B2 | 5/2007 | Fairbairn et al. | |
| 7,307,695 B2 | 12/2007 | Hazenberg et al. | |
| 7,335,462 B2 | 2/2008 | Fairbairn et al. | |
| 7,438,534 B2 | 10/2008 | Holland et al. | |
| 7,608,367 B1 | 10/2009 | Aigeldinger et al. | |
| 8,083,862 B2 | 12/2011 | Brown | |
| 8,465,903 B2 | 6/2013 | Weidman et al. | |
| 8,536,068 B2 | 9/2013 | Weidman et al. | |
| 8,552,334 B2 | 10/2013 | Tappan et al. | |
| 8,664,124 B2 | 3/2014 | Graff | |
| 8,664,513 B2 | 3/2014 | Pfenninger et al. | |
| 8,703,386 B2 | 4/2014 | Bass et al. | |
| 8,808,561 B2 | 8/2014 | Kanarik | |
| 8,883,028 B2 | 11/2014 | Kanarik | |
| 8,883,405 B2 | 11/2014 | Shiobara | |
| 9,023,731 B2 | 5/2015 | Ji et al. | |
| 9,261,784 B2 | 2/2016 | Wuister et al. | |
| 9,281,207 B2 | 3/2016 | Stowers et al. | |
| 9,310,684 B2 | 4/2016 | Meyers et al. | |
| 9,551,924 B2 | 1/2017 | Burkhardt et al. | |
| 9,576,811 B2 | 2/2017 | Kanarik et al. | |
| 9,632,411 B2 | 4/2017 | Michaelson et al. | |
| 9,719,169 B2 | 8/2017 | Mohn et al. | |
| 9,735,002 B2 | 8/2017 | Kawaguchi et al. | |
| 9,778,561 B2 | 10/2017 | Marks et al. | |
| 9,790,595 B2 | 10/2017 | Jung et al. | |
| 9,823,564 B2 | 11/2017 | Stowers et al. | |
| 9,829,805 B2 | 11/2017 | Michaelson et al. | |
| 9,996,004 B2 | 6/2018 | Smith et al. | |
| 10,025,179 B2 | 7/2018 | Meyers et al. | |
| 10,074,543 B2 | 9/2018 | Mahorowala et al. | |
| 10,228,618 B2 | 3/2019 | Meyers et al. | |
| 10,304,668 B2 | 5/2019 | Coppa et al. | |
| 10,416,554 B2 | 9/2019 | Meyers et al. | |
| 10,514,598 B2 | 12/2019 | Marks et al. | |
| 10,515,812 B1 | 12/2019 | Wang et al. | |
| 10,566,212 B2 | 2/2020 | Kanarik | |
| 10,580,585 B2 | 3/2020 | Snaith et al. | |
| 10,627,719 B2 | 4/2020 | Waller et al. | |
| 10,642,153 B2 | 5/2020 | Meyers et al. | |
| 10,649,328 B2 | 5/2020 | Stowers et al. | |
| 10,679,843 B2 | 6/2020 | Jeong et al. | |
| 10,732,505 B1 | 8/2020 | Meyers et al. | |
| 10,763,083 B2 | 9/2020 | Yang et al. | |
| 10,775,696 B2 | 9/2020 | Meyers et al. | |
| 10,782,610 B2 | 9/2020 | Stowers et al. | |
| 10,787,466 B2 | 9/2020 | Edson et al. | |
| 10,796,912 B2 | 10/2020 | Shamma et al. | |
| 10,815,391 B2 | 10/2020 | Lee et al. | |
| 10,831,096 B2 | 11/2020 | Marks et al. | |
| 11,079,682 B1 | 8/2021 | Han et al. | |
| 11,209,729 B2 | 12/2021 | Marks et al. | |
| 11,257,674 B2 | 2/2022 | Shamma et al. | |
| 11,314,168 B2 | 4/2022 | Tan et al. | |
| 11,462,417 B2 | 10/2022 | Delmas et al. | |
| 11,988,965 B2 | 5/2024 | Tan et al. | |
| 12,105,422 B2 | 10/2024 | Tan et al. | |
| 12,183,604 B2 | 12/2024 | Yu et al. | |
| 12,211,691 B2 | 1/2025 | Volosskiy et al. | |
| 12,278,125 B2 | 4/2025 | Yu et al. | |
| 12,346,035 B2 | 7/2025 | Dictus et al. | |
| 12,474,640 B2 | 11/2025 | Lee et al. | |
| 12,504,692 B2 | 12/2025 | Li et al. | |
| 12,510,825 B2 | 12/2025 | Tan et al. | |
| 12,510,826 B2 | 12/2025 | Tan et al. | |
| 2001/0024769 A1 | 9/2001 | Donoghue et al. | |
| 2001/0055731 A1 | 12/2001 | Irie | |
| 2002/0017243 A1 | 2/2002 | Pyo | |
| 2002/0180372 A1 | 12/2002 | Yamazaki | |
| 2003/0008246 A1 | 1/2003 | Cheng et al. | |
| 2003/0027060 A1 | 2/2003 | Lederer | |
| 2003/0134231 A1 | 7/2003 | Tsai et al. | |
| 2003/0183244 A1 | 10/2003 | Rossman | |
| 2004/0067444 A1 | 4/2004 | Wakabayashi et al. | |
| 2004/0084412 A1 | 5/2004 | Waldfried et al. | |
| 2004/0097388 A1 | 5/2004 | Brask et al. | |
| 2004/0113087 A1 | 6/2004 | Ikeda et al. | |
| 2004/0115956 A1 | 6/2004 | Ishida | |
| 2004/0175631 A1 | 9/2004 | Crocker et al. | |
| 2004/0178076 A1 | 9/2004 | Stonas et al. | |
| 2004/0191423 A1 | 9/2004 | Ruan et al. | |
| 2004/0203256 A1 | 10/2004 | Yang et al. | |
| 2004/0213563 A1 | 10/2004 | Irie | |
| 2004/0229169 A1 | 11/2004 | Sandstrom | |
| 2004/0233401 A1 | 11/2004 | Irie | |
| 2005/0142885 A1 | 6/2005 | Shinriki | |
| 2005/0167617 A1 | 8/2005 | Derra et al. | |
| 2005/0208389 A1 | 9/2005 | Ishibashi et al. | |
| 2005/0253077 A1 | 11/2005 | Ikeda et al. | |
| 2005/0257747 A1 | 11/2005 | Wakabayashi et al. | |
| 2006/0001064 A1 | 1/2006 | Hill et al. | |

(56) References Cited

U.S. PATENT DOCUMENTS

| | | |
|---|---|---|
| 2006/0046470 A1 | 3/2006 | Becknell et al. |
| 2006/0068173 A1 | 3/2006 | Kajiyama et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0228897 A1 | 10/2006 | Timans |
| 2006/0246713 A1 | 11/2006 | Tsai et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0259492 A1 | 11/2007 | Roh et al. |
| 2007/0287073 A1 | 12/2007 | Goodwin |
| 2008/0070128 A1 | 3/2008 | Wu et al. |
| 2008/0157011 A1 | 7/2008 | Nagai et al. |
| 2009/0134119 A1 | 5/2009 | Matsumaru et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0009274 A1 | 1/2010 | Yamamoto |
| 2010/0022078 A1 | 1/2010 | Rockenberger et al. |
| 2010/0068660 A1 | 3/2010 | Shibazaki et al. |
| 2010/0086880 A1 | 4/2010 | Saito et al. |
| 2010/0131093 A1 | 5/2010 | Yokoyama et al. |
| 2010/0197135 A1 | 8/2010 | Ishizaka |
| 2010/0209855 A1 | 8/2010 | Tanaka |
| 2010/0216310 A1 | 8/2010 | Metz et al. |
| 2010/0260994 A1 | 10/2010 | Groenen et al. |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2010/0330503 A1 | 12/2010 | Bae et al. |
| 2011/0104595 A1 | 5/2011 | Hayashi et al. |
| 2011/0117702 A1 | 5/2011 | Rietzler et al. |
| 2011/0195142 A1 | 8/2011 | Mitamura et al. |
| 2011/0198756 A1 | 8/2011 | Thenappan et al. |
| 2011/0200953 A1 | 8/2011 | Arima et al. |
| 2011/0209725 A1 | 9/2011 | Kim et al. |
| 2011/0242508 A1 | 10/2011 | Kobayashi |
| 2011/0244680 A1 | 10/2011 | Tohnoe et al. |
| 2011/0266252 A1 | 11/2011 | Thadani et al. |
| 2011/0277681 A1 | 11/2011 | Arena et al. |
| 2011/0292356 A1 | 12/2011 | Tsukinoki et al. |
| 2012/0024388 A1 | 2/2012 | Burrows et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0183689 A1 | 7/2012 | Suzuki et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1 | 1/2013 | Nemani et al. |
| 2013/0129995 A1 | 5/2013 | Ouattara et al. |
| 2013/0157177 A1 | 6/2013 | Yu et al. |
| 2013/0177847 A1 | 7/2013 | Chatterjee et al. |
| 2013/0183609 A1 | 7/2013 | Seon et al. |
| 2013/0224652 A1 | 8/2013 | Bass et al. |
| 2013/0299089 A1 | 11/2013 | Kim et al. |
| 2013/0323652 A1 | 12/2013 | Fernandez et al. |
| 2013/0330928 A1 | 12/2013 | Ishikawa et al. |
| 2013/0330932 A1 | 12/2013 | Rangarajan et al. |
| 2014/0014745 A1 | 1/2014 | Burrows et al. |
| 2014/0021673 A1 | 1/2014 | Chen et al. |
| 2014/0120688 A1 | 5/2014 | Booth, Jr. et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0209015 A1 | 7/2014 | Yamada et al. |
| 2014/0220489 A1 | 8/2014 | Kozuma et al. |
| 2014/0239462 A1 | 8/2014 | Shamma et al. |
| 2014/0255844 A1 | 9/2014 | Iwao et al. |
| 2014/0263172 A1 | 9/2014 | Xie et al. |
| 2014/0268082 A1 | 9/2014 | Michaelson et al. |
| 2014/0272726 A1 | 9/2014 | Chang |
| 2015/0020848 A1 | 1/2015 | Kim et al. |
| 2015/0041809 A1 | 2/2015 | Arnold et al. |
| 2015/0056542 A1 | 2/2015 | Meyers et al. |
| 2015/0077733 A1 | 3/2015 | Huang et al. |
| 2015/0079393 A1 | 3/2015 | Freedman et al. |
| 2015/0096683 A1 | 4/2015 | Deshmukh et al. |
| 2015/0125679 A1 | 5/2015 | Ishikawa |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0194343 A1 | 7/2015 | Chi et al. |
| 2015/0217330 A1 | 8/2015 | Haukka et al. |
| 2015/0221519 A1 | 8/2015 | Marks et al. |
| 2015/0243520 A1 | 8/2015 | Park et al. |
| 2015/0270148 A1 | 9/2015 | Shinoda et al. |
| 2015/0303064 A1 | 10/2015 | Singer et al. |
| 2015/0332922 A1 | 11/2015 | Chien et al. |
| 2015/0355549 A1 | 12/2015 | Xie et al. |
| 2016/0011505 A1 | 1/2016 | Stowers et al. |
| 2016/0011516 A1 | 1/2016 | Devilliers |
| 2016/0021660 A1 | 1/2016 | Krishnamurthy |
| 2016/0035631 A1 | 2/2016 | Lee et al. |
| 2016/0041471 A1 | 2/2016 | Briend et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0126106 A1 | 5/2016 | Shimizu et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0260588 A1 | 9/2016 | Park et al. |
| 2016/0284559 A1 | 9/2016 | Kikuchi et al. |
| 2016/0293405 A1 | 10/2016 | Matsumoto et al. |
| 2016/0314964 A1 | 10/2016 | Tang et al. |
| 2016/0343544 A1 | 11/2016 | Watanabe et al. |
| 2016/0357107 A1 | 12/2016 | Buchberger, Jr. et al. |
| 2016/0365248 A1 | 12/2016 | Mebarki et al. |
| 2016/0379824 A1 | 12/2016 | Wise et al. |
| 2017/0004974 A1 | 1/2017 | Manna et al. |
| 2017/0010535 A1 | 1/2017 | Fujitani et al. |
| 2017/0018506 A1 | 1/2017 | Cao et al. |
| 2017/0069462 A1 | 3/2017 | Kanarik et al. |
| 2017/0092495 A1 | 3/2017 | Chen et al. |
| 2017/0097569 A1 | 4/2017 | Yang et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0184961 A1 | 6/2017 | Nakagawa et al. |
| 2017/0192357 A1 | 7/2017 | Carcasi et al. |
| 2017/0229325 A1 | 8/2017 | Lubomirsky et al. |
| 2017/0261850 A1 | 9/2017 | Stowers et al. |
| 2017/0342553 A1 | 11/2017 | Yu et al. |
| 2018/0004083 A1 | 1/2018 | Marks et al. |
| 2018/0012759 A1 | 1/2018 | Smith et al. |
| 2018/0023192 A1 | 1/2018 | Chandra et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0093306 A1 | 4/2018 | Kang et al. |

(56) References Cited

U.S. PATENT DOCUMENTS

| | | |
|---|---|---|
| 2018/0122648 A1 | 5/2018 | Kim et al. |
| 2018/0151350 A1 | 5/2018 | Li |
| 2018/0164689 A1 | 6/2018 | Sano et al. |
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1 | 8/2018 | Glodde et al. |
| 2018/0233398 A1 | 8/2018 | Van Cleemput et al. |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2018/0323064 A1 | 11/2018 | Jung et al. |
| 2018/0337046 A1 | 11/2018 | Shamma et al. |
| 2018/0354804 A1 | 12/2018 | Venkatasubramanian et al. |
| 2018/0356731 A1 | 12/2018 | Tagawa |
| 2019/0027357 A1 | 1/2019 | Girard et al. |
| 2019/0041755 A1 | 2/2019 | Tanaka et al. |
| 2019/0043731 A1 | 2/2019 | Bristol et al. |
| 2019/0094685 A1 | 3/2019 | Marks et al. |
| 2019/0129307 A1 | 5/2019 | Kwon et al. |
| 2019/0131130 A1 | 5/2019 | Smith et al. |
| 2019/0137870 A1 | 5/2019 | Meyers et al. |
| 2019/0146337 A1 | 5/2019 | Zi et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0189428 A1 | 6/2019 | De Silva et al. |
| 2019/0198338 A1 | 6/2019 | Kim et al. |
| 2019/0204749 A1 | 7/2019 | Tel et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0378696 A1 | 12/2019 | Addepalli et al. |
| 2019/0391486 A1 | 12/2019 | Jiang et al. |
| 2020/0041897 A1 | 2/2020 | Moon et al. |
| 2020/0041901 A1 | 2/2020 | Namgung et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133133 A1 | 4/2020 | Park et al. |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0005425 A1 | 1/2021 | Yang et al. |
| 2021/0013034 A1 | 1/2021 | Wu et al. |
| 2021/0271170 A1 | 9/2021 | Telecky et al. |
| 2021/0287909 A1 | 9/2021 | Zhou et al. |
| 2021/0302833 A1 | 9/2021 | Weng et al. |
| 2021/0305040 A1 | 9/2021 | Kuo et al. |
| 2021/0397085 A1 | 12/2021 | Weidman et al. |
| 2022/0002882 A1 | 1/2022 | Kalutarage et al. |
| 2022/0020584 A1 | 1/2022 | Volosskiy et al. |
| 2022/0028684 A1 | 1/2022 | Chen et al. |
| 2022/0035247 A1 | 2/2022 | Tan et al. |
| 2022/0043334 A1 | 2/2022 | Tan et al. |
| 2022/0059362 A1 | 2/2022 | Li et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0359280 A1 | 11/2022 | Yang et al. |
| 2022/0365434 A1 | 11/2022 | Nardi et al. |
| 2022/0404713 A1 | 12/2022 | Tapily |
| 2023/0031955 A1 | 2/2023 | Yu et al. |
| 2023/0045336 A1 | 2/2023 | Yu et al. |
| 2023/0078946 A1 | 3/2023 | Grzeskowiak et al. |
| 2023/0100995 A1 | 3/2023 | Cardineau et al. |
| 2023/0107357 A1 | 4/2023 | Dictus et al. |
| 2023/0126516 A1 | 4/2023 | Wang et al. |
| 2023/0152701 A1 | 5/2023 | Kanakasabapathy |
| 2023/0230811 A1 | 7/2023 | Yu et al. |
| 2023/0259025 A1* | 8/2023 | Hansen ..................... G03F 7/427 |
| | | 430/5 |
| 2023/0266662 A1 | 8/2023 | Marks et al. |
| 2023/0266664 A1* | 8/2023 | Hansen ...................... G03F 7/36 |
| | | 430/325 |
| 2023/0266670 A1 | 8/2023 | Hansen et al. |
| 2023/0273516 A1 | 8/2023 | Marks et al. |
| 2023/0288798 A1* | 9/2023 | Hansen ............. H01L 21/02118 |
| 2023/0290657 A1 | 9/2023 | Yu et al. |
| 2023/0314946 A1* | 10/2023 | Hansen ................... G03F 7/167 |
| | | 430/270.1 |
| 2023/0314954 A1* | 10/2023 | Peter ................. H01L 21/67069 |
| | | 216/58 |
| 2023/0341781 A1 | 10/2023 | Han et al. |
| 2024/0027900 A1 | 1/2024 | Hajibabaeinajafabadi et al. |
| 2024/0036473 A1 | 2/2024 | Fujimoto et al. |
| 2024/0036483 A1 | 2/2024 | Dictus et al. |
| 2024/0045337 A1 | 2/2024 | Hajibabaeinajafabadi et al. |
| 2024/0053684 A1 | 2/2024 | Hajibabaeinajafabadi et al. |
| 2024/0145272 A1 | 5/2024 | Yu et al. |
| 2024/0329538 A1 | 10/2024 | Li et al. |
| 2024/0355650 A1 | 10/2024 | Kanakasabapathy et al. |
| 2024/0361696 A1 | 10/2024 | Tan et al. |
| 2024/0419078 A1 | 12/2024 | Tan et al. |
| 2025/0053080 A1 | 2/2025 | Marks et al. |
| 2025/0053084 A1 | 2/2025 | Hansen et al. |
| 2025/0053092 A1 | 2/2025 | Kenane et al. |
| 2025/0060673 A1 | 2/2025 | Wu et al. |
| 2025/0060674 A1 | 2/2025 | Li et al. |
| 2025/0093781 A1 | 3/2025 | Peter et al. |
| 2025/0112045 A1 | 4/2025 | Volosskiy et al. |
| 2025/0244672 A1 | 7/2025 | Weidman et al. |
| 2025/0244677 A1 | 7/2025 | Li et al. |
| 2025/0244678 A1 | 7/2025 | Lee et al. |
| 2025/0246460 A1 | 7/2025 | Yu et al. |
| 2025/0250485 A1 | 8/2025 | Dictus et al. |
| 2025/0271766 A1 | 8/2025 | Hansen et al. |
| 2025/0271782 A1 | 8/2025 | Dictus et al. |
| 2025/0291255 A1 | 9/2025 | Lee et al. |

FOREIGN PATENT DOCUMENTS

| | | |
|---|---|---|
| CN | 102610516 A | 7/2012 |
| CN | 102834902 A | 12/2012 |
| CN | 103119695 A | 5/2013 |
| CN | 103243310 A | 8/2013 |
| CN | 103943493 A | 7/2014 |
| CN | 105047541 A | 11/2015 |
| CN | 105579906 A | 5/2016 |
| CN | 106876251 A | 6/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 110609441 A | 12/2019 |
| CN | 111254416 A | 6/2020 |
| CN | 111258190 A | 6/2020 |
| EP | 0197286 A2 | 10/1986 |
| EP | 0197286 B1 | 9/1991 |

(56)        References Cited

FOREIGN PATENT DOCUMENTS

| | | | |
|---|---|---|---|
| EP | 0465064 | A2 | 1/1992 |
| EP | 1123423 | B1 | 8/2007 |
| EP | 2608247 | A1 | 6/2013 |
| EP | 3230294 | A1 | 10/2017 |
| EP | 3258317 | A1 | 12/2017 |
| JP | S5119974 | A | 2/1976 |
| JP | S57205736 | A | 12/1982 |
| JP | S5883847 | A | 5/1983 |
| JP | S58108744 | A | 6/1983 |
| JP | S6112653 | U | 1/1986 |
| JP | S61234035 | A | 10/1986 |
| JP | H04226462 | A | 8/1992 |
| JP | H0637050 | A | 2/1994 |
| JP | H06169021 | A | 6/1994 |
| JP | H06232041 | A | 8/1994 |
| JP | H07106224 | A | 4/1995 |
| JP | H07161607 | A | 6/1995 |
| JP | H07244386 | A | 9/1995 |
| JP | H0869959 | A | 3/1996 |
| JP | H08316237 | A | 11/1996 |
| JP | H08339950 | A | 12/1996 |
| JP | H09172022 | A | 6/1997 |
| JP | H09312247 | A | 12/1997 |
| JP | H1041206 | A | 2/1998 |
| JP | H10209133 | A | 8/1998 |
| JP | H10301298 | A | 11/1998 |
| JP | H11119440 | A | 4/1999 |
| JP | 2000305273 | A | 11/2000 |
| JP | 2000347413 | A | 12/2000 |
| JP | 2000356857 | A | 12/2000 |
| JP | 2002100558 | A | 4/2002 |
| JP | 2002118096 | A | 4/2002 |
| JP | 2003131364 | A | 5/2003 |
| JP | 2003213001 | A | 7/2003 |
| JP | 2003280155 | A | 10/2003 |
| JP | 2003532303 | A | 10/2003 |
| JP | 2004006798 | A | 1/2004 |
| JP | 2004510321 | A | 4/2004 |
| JP | 2004513515 | A | 4/2004 |
| JP | 2004259786 | A | 9/2004 |
| JP | 2005504146 | A | 2/2005 |
| JP | 2005260015 | A | 9/2005 |
| JP | 2006253282 | A | 9/2006 |
| JP | 2006310681 | A | 11/2006 |
| JP | 2007027617 | A | 2/2007 |
| JP | 2009192350 | A | 8/2009 |
| JP | 2009212404 | A | 9/2009 |
| JP | 2010016083 | A | 1/2010 |
| JP | 2010016314 | A | 1/2010 |
| JP | 2010500762 | A | 1/2010 |
| JP | 2010067979 | A | 3/2010 |
| JP | 2010123732 | A | 6/2010 |
| JP | 2010531931 | A | 9/2010 |
| JP | 2010239087 | A | 10/2010 |
| JP | 2011520242 | A | 7/2011 |
| JP | 2011529126 | A | 12/2011 |
| JP | 2012142481 | A | 7/2012 |
| JP | 2012173315 | A | 9/2012 |
| JP | 2012185485 | A | 9/2012 |
| JP | 5055743 | B2 | 10/2012 |
| JP | 2012191242 | A | 10/2012 |
| JP | 2013033291 | A | 2/2013 |
| JP | 2013047848 | A | 3/2013 |
| JP | 2013096011 | A | 5/2013 |
| JP | 2013526061 | A | 6/2013 |
| JP | 2013145874 | A | 7/2013 |
| JP | 2013151627 | A | 8/2013 |
| JP | 2013542944 | A | 11/2013 |
| JP | 2014504004 | A | 2/2014 |
| JP | 5544914 | B2 | 7/2014 |
| JP | 2014521111 | A | 8/2014 |
| JP | 2015504604 | A | 2/2015 |
| JP | 5705103 | B2 | 4/2015 |
| JP | 2015106640 | A | 6/2015 |
| JP | 2015201622 | A | 11/2015 |
| JP | 2016072557 | A | 5/2016 |
| JP | 2016517633 | A | 6/2016 |
| JP | 2016131238 | A | 7/2016 |
| JP | 2016530565 | A | 9/2016 |
| JP | 2016208027 | A | 12/2016 |
| JP | 2017045869 | A | 3/2017 |
| JP | 2017108053 | A | 6/2017 |
| JP | 2017116923 | A | 6/2017 |
| JP | 2017152689 | A | 8/2017 |
| JP | 2017532407 | A | 11/2017 |
| JP | 2018502173 | A | 1/2018 |
| JP | 2018025686 | A | 2/2018 |
| JP | 2018518688 | A | 7/2018 |
| JP | 2018164076 | A | 10/2018 |
| JP | 2018200930 | A | 12/2018 |
| JP | 2019500490 | A | 1/2019 |
| JP | 2019024129 | A | 2/2019 |
| JP | 2019506730 | A | 3/2019 |
| JP | 2019053305 | A | 4/2019 |
| JP | 2019056730 | A | 4/2019 |
| JP | 2019135755 | A | 8/2019 |
| JP | 2019192814 | A | 10/2019 |
| JP | 2019532182 | A | 11/2019 |
| JP | 2021523403 | A | 9/2021 |
| JP | 2022502714 | A | 1/2022 |
| KR | 890015374 | A | 10/1989 |
| KR | 900001238 | B1 | 3/1990 |
| KR | 950001406 | A | 1/1995 |
| KR | 960000375 | B1 | 1/1996 |
| KR | 19990029141 | A | 4/1999 |
| KR | 19990070327 | A | 9/1999 |
| KR | 20000073111 | A | 12/2000 |
| KR | 20020000292 | A | 1/2002 |
| KR | 20050112115 | A | 11/2005 |
| KR | 100575847 | B1 | 5/2006 |
| KR | 20070003657 | A | 1/2007 |
| KR | 20080046577 | A | 5/2008 |
| KR | 100841495 | B1 | 6/2008 |
| KR | 20090042059 | A | 4/2009 |
| KR | 20100090643 | A | 8/2010 |
| KR | 20110007192 | A | 1/2011 |
| KR | 20110009739 | A | 1/2011 |
| KR | 20120078672 | A | 7/2012 |
| KR | 20120093781 | A | 8/2012 |
| KR | 20130007389 | A | 1/2013 |
| KR | 20130093038 | A | 8/2013 |
| KR | 20140047120 | A | 4/2014 |
| KR | 101426105 | B1 | 8/2014 |
| KR | 20140106442 | A | 9/2014 |
| KR | 20140109816 | A | 9/2014 |
| KR | 20150008065 | A | 1/2015 |
| KR | 20150091260 | A | 8/2015 |
| KR | 20150127145 | A | 11/2015 |
| KR | 20150129781 | A | 11/2015 |
| KR | 20150143480 | A | 12/2015 |
| KR | 20160035995 | A | 4/2016 |
| KR | 20160082969 | A | 7/2016 |
| KR | 20170066218 | A | 6/2017 |
| KR | 20170066225 | A | 6/2017 |
| KR | 20180036263 | A | 4/2018 |
| KR | 20180054917 | A | 5/2018 |
| KR | 20180116438 | A | 10/2018 |
| KR | 20180119471 | A | 11/2018 |
| KR | 20190085654 | A | 7/2019 |
| KR | 20210015639 | A | 2/2021 |
| KR | 20210142118 | A | 11/2021 |
| KR | 20220025020 | A | 3/2022 |
| KR | 20220130783 | A | 9/2022 |
| KR | 20230029977 | A | 3/2023 |
| TW | 200504864 | A | 2/2005 |
| TW | 200846333 | A | 12/2008 |
| TW | 200903686 | A | 1/2009 |
| TW | 200947117 | A | 11/2009 |
| TW | 201005568 | A | 2/2010 |
| TW | 201145383 | A | 12/2011 |
| TW | 201224190 | A | 6/2012 |
| TW | I365354 | B | 6/2012 |
| TW | 201241555 | A | 10/2012 |
| TW | 201245918 | A | 11/2012 |

(56) References Cited

FOREIGN PATENT DOCUMENTS

| TW | 201246273 | A | 11/2012 |
|----|-----------|---|---------|
| TW | 201501179 | A | 1/2015 |
| TW | I494689 | B | 8/2015 |
| TW | 201631377 | A | 9/2016 |
| TW | 201729006 | A | 8/2017 |
| TW | 201734025 | A | 10/2017 |
| TW | 201826034 | A | 7/2018 |
| TW | 201830472 | A | 8/2018 |
| TW | 201837066 | A | 10/2018 |
| TW | 201931011 | A | 8/2019 |
| TW | 202001407 | A | 1/2020 |
| TW | 202006168 | A | 2/2020 |
| TW | 202308466 | A | 2/2023 |
| TW | 202318103 | A | 5/2023 |
| WO | WO-2002103764 | A1 | 12/2002 |
| WO | WO-03029015 | A2 | 4/2003 |
| WO | WO-2004095551 | A1 | 11/2004 |
| WO | WO-2007123539 | A1 | 11/2007 |
| WO | WO-2008019362 | A2 | 2/2008 |
| WO | WO-2008088076 | A1 | 7/2008 |
| WO | WO-2011081151 | A1 | 7/2011 |
| WO | WO-2011137059 | A2 | 11/2011 |
| WO | WO-2012075249 | A1 | 6/2012 |
| WO | WO-2012048094 | A3 | 7/2012 |
| WO | WO-2013007442 | A1 | 1/2013 |
| WO | WO-2013078211 | A1 | 5/2013 |
| WO | WO-2014152023 | A1 | 9/2014 |
| WO | WO-2014172142 | A1 | 10/2014 |
| WO | WO-2016065120 | A1 | 4/2016 |
| WO | WO-2016144960 | A1 | 9/2016 |
| WO | WO-2016208300 | A1 | 12/2016 |
| WO | WO-2017002497 | A1 | 1/2017 |
| WO | WO-2017066319 | A2 | 4/2017 |
| WO | WO-2017109040 | A1 | 6/2017 |
| WO | WO-2017153725 | A1 | 9/2017 |
| WO | WO-2017198418 | A1 | 11/2017 |
| WO | WO-2018004551 | A1 | 1/2018 |
| WO | WO-2018004646 | A1 | 1/2018 |
| WO | WO-2018061670 | A1 | 4/2018 |
| WO | WO-2018189413 | A1 | 10/2018 |
| WO | WO-2019163455 | A1 | 8/2019 |
| WO | WO-2019217749 | A1 | 11/2019 |
| WO | WO-2019222320 | A1 | 11/2019 |
| WO | WO-2019230462 | A1 | 12/2019 |
| WO | WO-2019241402 | A1 | 12/2019 |
| WO | WO-2020014179 | A1 | 1/2020 |
| WO | WO-2020030855 | A2 | 2/2020 |
| WO | WO-2020102085 | A1 | 5/2020 |
| WO | WO-2020132281 | A1 | 6/2020 |
| WO | WO-2020190941 | A1 | 9/2020 |
| WO | WO-2020223011 | A1 | 11/2020 |
| WO | WO-2020223152 | A1 | 11/2020 |
| WO | WO-2020263750 | A1 | 12/2020 |
| WO | WO-2020264158 | A1 | 12/2020 |
| WO | WO-2020264557 | A1 | 12/2020 |
| WO | WO-2020264571 | A1 | 12/2020 |
| WO | WO-2021067632 | A2 | 4/2021 |
| WO | WO-2021072042 | A1 | 4/2021 |
| WO | WO-2021146138 | A1 | 7/2021 |
| WO | WO-2021202681 | A1 | 10/2021 |
| WO | WO-2021262529 | A1 | 12/2021 |
| WO | WO-2022005808 | A1 | 1/2022 |
| WO | WO-2022103764 | A1 | 5/2022 |
| WO | WO-2022103949 | A1 | 5/2022 |
| WO | WO-2022125388 | A1 | 6/2022 |

OTHER PUBLICATIONS

CN Office Action dated Dec. 2, 2024 in CN Application No. 202211142175.7, with English Translation.
CN Office Action dated Dec. 13, 2023 in CN Application No. 201810783756.6 with English translation.
CN Office Action dated Jan. 3, 2024 in CN Application No. 202310318757.4 with English Translation.
CN Office Action dated Jan. 23, 2024 in CN Application No. 202080046943.1 with English Translation.
CN Office Action dated Jul. 23, 2024 in CN Application No. 201810783756.6 with English translation.
CN Office Action dated Mar. 14, 2024 in CN Application No. 201810783756.6, with English Translation.
CN Office Action dated May 29, 2025 in CN Application No. 202211142175.7 with English translation.
CN Office Action dated Sep. 14, 2024 in CN Application No. 202310318757.4 with English translation.
CN Office Action dated Sep. 23, 2024 in CN Application No. 202080046943.1 with English translation.
Dahuang, D., et al., Functional Thin Films and Their Deposition Preparation Techniques, Metallurgy Industrial Press, Jan. 31, 2013, pp. 450-454. [with English Translation].
EP Extended European Search report dated Nov. 29, 2023 in EP Application No. 23173688.5.
EP Extended European Search report dated Oct. 25, 2023, in Application No. EP21837274.6.
EP Office Action dated Jan. 21, 2025 in EP Application No. 23173688.5.
EP Partial European Search Report dated Aug. 29, 2023, in Application No. 23173688.5.
International Preliminary Report on Patentability and Written Opinion dated Dec. 28, 2023 in PCT Application No. PCT/US2022/033488.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Preliminary Report on Patentability and Written Opinion dated Nov. 14, 2024 in PCT Application No. PCT/US2023/019871.
International Preliminary Report on Patentability dated May 25, 2023, in Application No. PCT/US2021/058647.
International Search Report and Written Opinion dated Aug. 17, 2023, in Application No. PCT/US2023/019871.
International Search Report and Written Opinion dated Dec. 26, 2024 in PCT Application No. PCT/US2024/046887.
International Search Report and Written Opinion dated Feb. 21, 2025 in PCT Application No. PCT/US2024/054953.
International Search Report and Written Opinion dated Jul. 4, 2024 in PCT ApplicationNo. PCT/US2024/019555.
International Search Report and Written Opinion dated Nov. 20, 2024 in PCT Application No. PCT/US2024/039915.
International Search Report and Written Opinion dated Oct. 13, 2023 in PCT Application No. PCT/US2023/069419.
International Search Report and Written Opinion dated Oct. 17, 2022 in PCT Application No. PCT/US2022/033488.
International Search Report and Written Opinion dated Sep. 13, 2024 in PCT Application No. PCT/US2024/033522.
JP Notice of Allowances dated Aug. 27, 2024 in JP Application No. 2022-559416 with English translation.
JP Notice of Allowances dated Sep. 3, 2024 in JP Application No. 2023-63868 with English translation.
JP Office Action dated Apr. 2, 2024 in JP Application No. 2022-559416, with English Translation.
JP Office Action dated Feb. 13, 2024 in JP Application No. 2023-63868, with English Translation.
JP Office Action dated Jan. 7, 2025 in JP Application No. 2023-533602, with English Translation.
JP Office Action dated Jan. 9, 2024 in JP Application No. 2023-179933, with English Translation.
JP Office Action dated Jan. 9, 2024 in JP Application No. 2023-184334 with English Translation.

(56) References Cited

OTHER PUBLICATIONS

JP Office Action dated Jun. 10, 2025 in JP Application No. 2024559372, awaiting English Translation.
JP Office Action dated Jun. 10, 2025 in JP Application No. 2024559372.
JP Office Action dated Jun. 27, 2023, in application No. JP2023-63868 with English translation.
JP Office Action dated Mar. 5, 2024 in JP Application No. 2021-575910, with English Translation.
JP Office Action dated May 13, 2025 in JP Application No. 2023-502906, with English Translation.
JP Office Action dated Nov. 12, 2024 in JP Application No. 2024-522188 with English translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 10, 2023 in Application No. JP2022-552422 with English Translation.
KR Notice of Allowance dated Aug. 1, 2024 in KR Application No. 10-2024-7012307, with English Translation.
KR Notice of Allowance dated Dec. 12, 2024 in KR Application No. 10-2016-0152489, with English Translation.
KR Notice of Allowance dated Jan. 23, 2025 in KR Application No. 10-2024-7037880, with English Translation.
KR Notice of Allowances dated Oct. 16, 2024 in KR Application No. 10-2022-7002869 with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Aug. 11, 2023, in Application No. KR10-2023-7011840 with English translation.
KR Office Action dated Feb. 5, 2025 in KR Application No. 10-2022-7037995, with English Translation.
KR Office Action dated Feb. 29, 2024 in KR Application No. 10-2022-7026649, with English Translation.
KR Office Action dated Jan. 15, 2025 in KR Application No. 10-2023-7023253, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
KR Office Action dated Mar. 13, 2025 in KR Application No. 10-2023-7004801, with English Translation.
KR Office Action dated Mar. 14, 2024 in KR Application No. 10-2021-7022858, with English Translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
KR Office Action dated Nov. 28, 2024 in KR Application No. 10-2022-7014896, with English Translation.
SG Written Opinion dated Aug. 30, 2024 in SG Application No. 11202114183P.
TW Office Action and Search Report dated Jan. 16, 2025 in TW Application No. 113105443, with English Translation.
TW Office Action dated Apr. 17, 2025 in TW Application No. 113105443, with English Translation.
TW Office Action dated Apr. 17, 2025 in TW Application No. 113118322, with English Translation.
TW Office Action dated Apr. 19, 2024 in TW Application No. 112146727 with English translation.
TW Office Action dated Apr. 22, 2024 in TW Application No. 112126160 with English translation.
TW Office Action dated Aug. 17, 2023, in application No. TW110124741 with Translation.
TW Office Action dated Jan. 11, 2024 in TW Application No. 108146890, with English Translation.

TW Office Action dated Jan. 20, 2025 in TW Application No. 108146890, with English Translation.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 113107490 with English translation.
TW Office Action dated Mar. 11, 2025 in TW Application No. 110126445, with English Translation.
TW Office Action dated Mar. 21, 2024 in TW Application No. 108146890, with English Translation.
TW Office Action dated Nov. 26, 2024 in TW Application No. 110126445, with English Translation.
TW Office Action dated Oct. 13, 2023, in application No. TW109121680 with English Translation.
U.S. Advisory Action dated Apr. 16, 2024 in U.S. Appl. No. 17/596,648.
U.S. Corrected Notice of Allowance dated Jun. 5, 2025 in U.S. Appl. No. 18/377,245.
U.S. Corrected Notice of Allowance dated Mar. 20, 2025 in U.S. Appl. No. 18/377,245.
U.S. Final Office Action dated Feb. 27, 2024 in U.S. Appl. No. 18/298,003.
U.S. Final Office Action dated Jun. 6, 2025 in U.S. Appl. No. 18/700,238.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated May 3, 2024 in U.S. Appl. No. 18/297,989.
U.S. Final Office Action dated May 9, 2024 in U.S. Appl. No. 17/309,587.
U.S. Final Office Action dated Nov. 9, 2023 in U.S. Appl. No. 17/455,185.
U.S. Non-Final Office Action dated Apr. 17, 2025 in U.S. Appl. No. 18/769,038.
U.S. Non-Final Office Action dated Feb. 1, 2024 in U.S. Appl. No. 17/759,281.
U.S. Non-Final Office Action dated Feb. 20, 2025 in U.S. Appl. No. 18/700,238.
U.S. Non-Final Office Action dated Jan. 3, 2025 in U.S. Appl. No. 18/769,038.
U.S. Non-Final Office Action dated Jan. 24, 2025 in U.S. Appl. No. 18/769,048.
US Non-Final Office Action dated Jun. 18, 2025 in U.S. Appl. No. 17/753,110.
U.S. Non-Final Office Action dated Jun. 21, 2024 in U.S. Appl. No. 17/596,648.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Non-Final Office Action dated Mar. 5, 2025 in U.S. Appl. No. 18/850,628.
US Non-Final Office Action dated May 5, 2025 in U.S. Appl. No. 18/769,048.
U.S. Non-Final Office Action dated May 29, 2024 in U.S. Appl. No. 18/298,003.
U.S. Non-Final Office Action dated Nov. 6, 2023, in U.S. Appl. No. 17/309,587.
U.S. Non-Final Office Action dated Nov. 20, 2023 in U.S. Appl. No. 18/377,245.
U.S. Non-Final Office Action dated Oct. 1, 2024 in U.S. Appl. No. 17/309,587.
U.S. Non-Final Office Action dated Oct. 9, 2024 in U.S. Appl. No. 18/377,245.

(56) References Cited

OTHER PUBLICATIONS

U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Notice of Allowance dated Apr. 9, 2025 in U.S. Appl. No. 18/850,990.
U.S. Notice of Allowance dated Aug. 7, 2024 in U.S. Appl. No. 18/184,545.
U.S. Notice of Allowance dated Aug. 16, 2024 in U.S. Appl. No. 17/596,648.
U.S. Notice of Allowance dated Dec. 13, 2024 in U.S. Appl. No. 18/377,267.
U.S. Notice of Allowance dated Mar. 6, 2024 in U.S. Appl. No. 18/184,545.
U.S. Notice of Allowance dated Mar. 7, 2025 in U.S. Appl. No. 18/377,245.
U.S. Notice of Allowance dated Mar. 13, 2024 in U.S. Appl. No. 18/184,545.
U.S. Notice of Allowance dated Nov. 14, 2024 in U.S. Appl. No. 17/309,587.
U.S. Appl. No. 18/850,990, inventors Lee Y, et al., filed Sep. 25, 2024.
U.S. Appl. No. 18/855,026, inventors Lee Y, etal., filed Oct. 8, 2024.
U.S. Appl. No. 19/076,745, inventors Yu J etal., filed Mar. 11, 2025.
U.S. Appl. No. 19/179,005, inventors Dictus D et al., filed Apr. 15, 2025.
U.S. Appl. No. 19/181,906, inventors Li D et al., filed Apr. 17, 2025.
U.S. Appl. No. 19/182,430, inventors Weidman T.Wet al., filed Apr. 17, 2025.
U.S. Appl. No. 19/202,425, inventors Hansen E.C et al., filed May 8, 2025.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction Requirement dated Mar. 20, 2025 in U.S. Appl. No. 17/753,110.
U.S. Restriction Requirement dated Nov. 20, 2023 in U.S. Appl. No. 17/759,281.
U.S. Restriction requirement dated Sep. 7, 2023 in U.S. Appl. No. 17/309,587.
U.S. Supplemental Notice of Allowance dated Mar. 17, 2025 in U.S. Appl. No. 18/377,267.
Banerjee, D. et al., "Potential of Metal-Organic Frameworks for Separation of Xenon and Krypton", Accounts of Chemical Research, 2015, vol. 48, No. 2, pp. 211-219.
Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
Chinese First Office Action dated May 24, 2017 issued in Application No. CN 201510053668.7.
Chinese Second Office Action dated Feb. 28, 2018 issued in Application No. CN 201510053668.7.
CN Office Action dated Jun. 8, 2022 in Application No. CN202180002531.2 With English Translation.
CN Office Action dated Jun. 1, 2023, in application No. CN201810783756 with English translation.
CN Office Action dated Nov. 16, 2022, in Application No. CN202180002531.2 with English translation.
CN Office Action dated Nov. 18, 2022, in Application No. CN201810783756.6 with English translation.
Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.

Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Jun. 26, 2023, in Application No. 20831242.1.
EP Extended European Search Report dated Jun. 26, 2023, in Application No. 20831343.7.
EP Extended European Search report dated Jun. 28, 2023, in Application No. EP 20832501.9.
European Search Report dated Feb. 15, 2022, in Application No. EP21741104.
European Office Action dated Feb. 25, 2022 in U.S. Appl. No. 21/741,104.
Extended European Search Report dated Dec. 23, 2021, in Application No. EP19800353.5.
Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].
Fujifilm Corp., (Presentation) "Negative tone development process for double patterning," 5th International Symposium on Immersion Lithography, Sep. 2008, Presentation Slides No. P-1-P-27.
Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S. et al., (Jan. 12, 2017) "New Generation Electron Beam Resists: A Review," Chem. Mater., 29:1898-1917.
Gerritsen et al., (Apr. 1, 1986) "Laser-generated plasma as soft x-ray source," J. Appl. Phys., 59(7):2337-2344.
Gross, R.A. et al., "Biodegradable Polymers for the Environment", Science, Aug. 2, 2002, vol. 297, No. 5582, pp. 803-807.
Hamley, I.W., "Nanostructure fabrication using block copolymers", Nanotechnology. Sep. 2003. 17;14(10):R39-R54.
Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.

(56) References Cited

OTHER PUBLICATIONS

International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Aug. 8, 2018 issued in Application No. PCT/US2018/028192.
International Search Report and Written Opinion dated Jan. 27, 2021 issued in Application No. PCT/US2020/054730.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Mar. 23, 2021 issued in Application No. PCT/US2020/053856.
International Search Report and Written Opinion dated Mar. 24, 2022, for International Application No. PCT/US2021/061751.
International Search Report and Written Opinion dated May 3, 2023, in Application No. PCT/US2023/060306.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.

International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 16, 2018 issued in Application No. PCT/US2018/032783.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Joo, W. et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Apr. 11, 2023 in Application No. JP2021-176082 with English translation.
JP Office Action dated Apr. 27, 2023 in Application No. JP2021-575910 with English translation.
JP Office Action dated Feb. 28, 2023 in Application No. JP2020-562160 with English translation.
JP Office Action dated Jan. 17, 2023, in Application No. JP2022-552422 with English translation.
JP Office Action dated Jun. 14, 2022, in Application No. JP20190563508 with English translation.
JP Office Action dated Jun. 27, 2023, in Application No. JP2022-552422 with English translation.
JP Office Action dated Jun. 28, 2022 in Application No. JP2021560945 with English translation.
Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
KR Office Action dated Feb. 8, 2022, in Application No. KR10-2021-7030794 with English Translation.
KR Office Action dated Jan. 2, 2023 in Application No. KR10-2022-7027233 with English translation.
KR Office Action dated May 9, 2022, in Application No. KR1020217030794 with English translation.
KR Office Action dated Sep. 28, 2022, in Application No. KR10-2022-7027233 with English translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.

(56)        References Cited

OTHER PUBLICATIONS

Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.

Lu, Y., et al., "Continuous formation of supported cubic and hexagonal mesoporous films by sol-gel dip-coating" Nature, Sep. 1997, 389(6649), pp. 364-368.

Mackus, A.J., et al. "The use of atomic layer deposition in advanced nanopatterning", Nanoscale. Jul. 25, 2014; 6(19):10941-60.

Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.

Mcginniss, Vincent D., (1978) "Light Sources," Edited by: Pappas, S. Peter, UV Curing: Science and Technology; technology marketing corporation, 642 Westover Rd., Stamford, CT, USA; pp. 96-129.

Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.

Molloy, K. C., "Precursors for the Formation of Tin (IV) Oxide and Related Materials", Journal of Chemical Research, 2008, vol. 2008, No. 10, pp. 549-554.

Nazarov, D.V., et al., "Atomic layer deposition of tin dioxide nanofilms: A review", Rev. Adv. Mater. Sci. Jun. 1, 2015; 40(3):262-75.

Notice of Allowance dated Dec. 9, 2021 in U.S. Appl. No. 17/310,635.

Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).

Rothschild, et al., "Liquid immersion lithography: Why, how, and when?" Journal Vacuum Science Technology, Nov./Dec. 2004, pp. 2877-2881.

Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.

Spitzer et al., (Mar. 1, 1986) "Conversion efficiencies from laser-produced plasmas in the extreme ultraviolet regime," J. Appl. Phys., 79(5):2251-2258.

Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.

Stulen, et al., "Extreme Ultraviolet Lithography" IEEE Journal of Quantum Electronics, vol. 35, No. 5, May 1999, pp. 694-699.

Sundberg, P. et al., "Organic and Inorganic-organic Thin Film Structures by Molecular Layer Deposition: A Review", Beilstein Journal of Nanotechnology, 2014, vol. 5, pp. 1104-1136.

Taiwanese First Office Action dated Aug. 10, 2020 issued in Application No. TW 105137362.

Taiwanese First Office Action dated May 31, 2018 issued in Application No. TW 104103153.

Taiwanese Office Action dated Apr. 10, 2023 in TW Application No. TW108140940 with English translation.

Taiwanese Second Office Action dated Nov. 18, 2020 issued in Application No. TW 105137362.

TW Office Action dated Jan. 9, 2023 In Application No. TW20190116155 with English translation.

TW Office Action dated Sep. 5, 2022, in Application No. TW110101388 with English translation.

TW Office Action dated Sep. 8, 2022 in Application No. TW111123386 with English translation.

TW First Office Action dated Oct. 6, 2021, in application No. TW20180116415 with English translation.

TW Office Action dated Apr. 29, 2022 in Application No. TW110118172 with English translation.

TW Office Action dated Jan. 13, 2023, in Application No. TW110124741 with English translation.

TW Office Action dated Jan. 19, 2023 in Application No. TW110141961 with English translation.

TW Office Action dated Jun. 3, 2022, in Application No. TW110143913 with English translation.

TW Office Action dated Mar. 7, 2022, in Application No. TW110101388 with English translation.

TW Office Action dated May 16, 2023, in Application No. TW20190146890 with English translation.

US Final Office Action, dated Feb. 5, 2019 issued in U.S. Appl. No. 15/495,701.

US Final Office Action, dated May 11, 2017, issued in U.S. Appl. No. 14/610,038.

U.S. Final Office Action dated May 12, 2023 in U.S. Appl. No. 17/455,185.

US Final Office Action, dated Sep. 10, 2018, issued in U.S. Appl. No. 15/691,659.

U.S. Non-Final office Action dated Feb. 7, 2023 in U.S. Appl. No. 17/455,185.

U.S. Non-Final Office Action dated May 11, 2023, in U.S. Appl. No. 17/452,365.

US Notice of Allowance, dated Apr. 25, 2018 issued in U.S. 14/948,109.

US Notice of Allowance, dated Aug. 22, 2017, issued in U.S. Appl. No. 14/610,038.

U.S. Notice of Allowance dated Feb. 22, 2022 in U.S. Appl. No. 17/310,635.

US Notice of Allowance, dated Jul. 28, 2020, issued in U.S. Appl. No. 16/206,959.

US Notice of Allowance, dated Jun. 10, 2020 issued in U.S. Appl. No. 15/979,340.

US Notice of Allowance dated Sep. 15, 2021, issued in U.S. Appl. No. 16/691,508.

US Notice of Allowance, dated Sep. 19, 2019, issued in U.S. Appl. No. 15/691,659.

US Notice of Allowance, dated Sep. 30, 2021 issued in U.S. Appl. No. 17/008,095.

US Notice of Allowance dated Sep. 9, 2021, issued in U.S. Appl. No. 16/691,508.

US Office Action, dated Apr. 9, 2019, issued in U.S. Appl. No. 15/691,659.

US Office Action, dated Aug. 9, 2018 issued in U.S. Appl. No. 15/495,701.

US Office Action, dated Jan. 23, 2017, issued in U.S. Appl. No. 14/610,038.

US Office Action, dated Mar. 18, 2021 issued in U.S. Appl. No. 17/008,095.

US Office Action, dated Mar. 5, 2020, issued in U.S. Appl. No. 16/206,959.

US Office Action dated May 14, 2021 issued in U.S. Appl. No. 16/691,508.

US Office Action, dated May 21, 2018, issued in U.S. Appl. No. 15/691,659.

US Office Action, dated Nov. 2, 2017, issued in U.S. Appl. No. 14/948,109.

US Office Action, dated Nov. 6, 2019 issued in U.S. Appl. No. 15/979,340.

U.S. Appl. No. 17/759,896, inventors Nagabhirava et al., filed Aug. 1, 2022.

U.S. Appl. No. 17/905,754, inventors Kanakasabapathy et al., filed Sep. 6, 2022.

U.S. Appl. No. 18/005,169, inventors Hansen et al., filed Jan. 11, 2023.

U.S. Appl. No. 18/005,328, inventors Hansen et al., filed Jan. 12, 2023.

U.S. Appl. No. 18/005,571 inventors Hansen et al., filed Jan. 13, 2023.

U.S. Appl. No. 18/005,594, inventors Hansen et al., filed Jan. 13, 2023.

U.S. Appl. No. 18/005,595, inventors Hansen et al., filed Jan. 13, 2023.

(56) References Cited

OTHER PUBLICATIONS

U.S. Appl. No. 18/011,707, inventors Peter et al., filed Dec. 20, 2022.
U.S. Appl. No. 18/184,545, inventors Yu et al., filed Mar. 15, 2023.
U.S. Appl. No. 18/297,989, inventors Marks et al., filed Apr. 10, 2023.
U.S. Appl. No. 18/298,003, inventors Marks et al., filed Apr. 10, 2023.
U.S. Restriction Requirement dated Nov. 14, 2022 in U.S. Appl. No. 17/455,185.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
CN Office Action dated Aug. 12, 2025 in CN Application No. 202211142175.7, with English Translation.
EP Extended European Search report dated Sep. 24, 2025 in EP Application No. 25172399.5.
Fitzgerald A., et al., "Determination of Trace Metals in Positive Photoresist," Journal of the Electrochemical Society, May 1992, vol. 139 (5), pp. 1413-1414.
International Preliminary Report on Patentability and Written Opinion dated Oct. 2, 2025 in PCT Application No. PCT/US2024/019555.
JP Office Action dated Aug. 5, 2025 in JP Application No. 2021-575910, with English Translation.
JP Office Action dated Sep. 9, 2025 in JP Application No. 2023-502906, with English Translation.
KR Office Action dated Aug. 27, 2025 in KR Application No. 10-2022-7014896, with English Translation.
KR Office Action dated Jul. 22, 2025 in KR Application No. 10-2024-7037744, with English Translation.
SG Written Opinion dated Jun. 30, 2025 in SG Application No. 11202114183P.
SG Written Opinion dated Jun. 30, 2025 in SG Application No. 11202251459E.
TW Office Action and Search Report dated Jul. 8, 2025 in TW Application No. 110145602, with English Translation.
TW Office Action dated Jul. 24, 2025 in TW Application No. 113118322, with English Translation.
U.S. Final Office Action dated Aug. 20, 2025 in U.S. Appl. No. 18/769,038.
U.S. Final Office Action dated Aug. 22, 2025 in U.S. Appl. No. 18/769,048.
U.S. Final Office Action dated Jul. 1, 2025 in U.S. Appl. No. 18/850,628.

US Non-Final Office Action dated Jul. 14, 2025 in U.S. Appl. No. 18/005,571.
U.S. Non-Final Office Action dated Oct. 1, 2025 in U.S. Appl. No. 17/905,632.
U.S. Notice of Allowance dated Jul. 8, 2025 in U.S. Appl. No. 18/850,990.
U.S. Notice of Allowance dated Sep. 16, 2025 in U.S. Appl. No. 18/700,238.
U.S. Appl. No. 19/352,826, inventors Lee Y et al., filed Oct. 8, 2025.
EP Office Action dated Oct. 24, 2025 in EP Application No. 24775376.7.
TW Office Action and Search Report dated Nov. 6, 2025 in TW Application No. 113109390, with English Translation.
TW Office Action and Search Report dated Oct. 31, 2025 in TW Application No. 113128085, with English Translation.
U.S. Final Office Action dated Nov. 17, 2025 in U.S. Appl. No. 17/753,110.
U.S. Notice of Allowance dated Oct. 17, 2025 in U.S. Appl. No. 18/769,038.
U.S. Notice of Allowance dated Oct. 17, 2025 in U.S. Appl. No. 18/769,048.
U.S. Appl. No. 19/387,102, inventors Li D et al., filed Nov. 12, 2025.
International Preliminary Report on Patentability and Written Opinion dated Dec. 26, 2025 in PCT Application No. PCT/US2024/033522.
JP Office Action dated Dec. 9, 2025 in JP Application No. 2024559373, with English Translation.
KR Office Action dated Dec. 17, 2025 in KR Application No. 10-2025-7013740, with English Translation.
KR Office Action dated Dec. 19, 2025 in KR Application No. 10-2025-7012180, with English Translation.
KR Office Action dated Nov. 12, 2025 in KR Application No. 10-2023-7004801, with English Translation.
KR Office Action dated Nov. 24, 2025 in KR Application No. 10-2024-7043554, with English Translation.
SG Written Opinion dated Nov. 7, 2025 in SG Application No. 11202251015X.
TW Office Action and Search Report dated Jan. 12, 2026 in TW Application No. 114113726, with English Translation.
TW Office Action and Search Report dated Nov. 27, 2025 in TW Application No. 110126445, with English Translation.
TW Office Action dated Jan. 9, 2026 in TW Application No. 113118322, withEnglish Translation.
TW Office Action dated Jan. 13, 2026 in TW Application No. 114115269, with English Translation.
U. S. Final Office Action dated Dec. 4, 2025 in U.S. Appl. No. 18/005,571.
U.S. Advisory Action dated Jan. 16, 2026 in U.S. Appl. No. 17/753,110.
U.S. Non-Final Office Action dated Dec. 18, 2025 in U.S. Appl. No. 18/580,334.
U.S. Non-Final Office Action dated Jan. 27, 2026 in U.S. Appl. No. 18/932,475.
U.S. Notice of Allowance dated Dec. 4, 2025 in U.S. Appl. No. 18/850,628.
U.S. Appl. No. 19/393,174, inventors Tan S.S et al., filed on Nov. 18, 2025.
U.S. Appl. No. 19/490,152, inventors Agnew D.W et al., filed on Dec. 4, 2025.
JP Office Action dated Jan. 20, 2026 in JP Application No. 2025-073845, with English Translation.

* cited by examiner

Provide in a process chamber a photopatterned metal-containing resist on a surface of a semiconductor substrate                202

Dry develop the photopatterned metal-containing resist by selectively removing a portion of the resist by exposure to a dry development chemistry comprising an organic vapor to form a resist mask                204

200

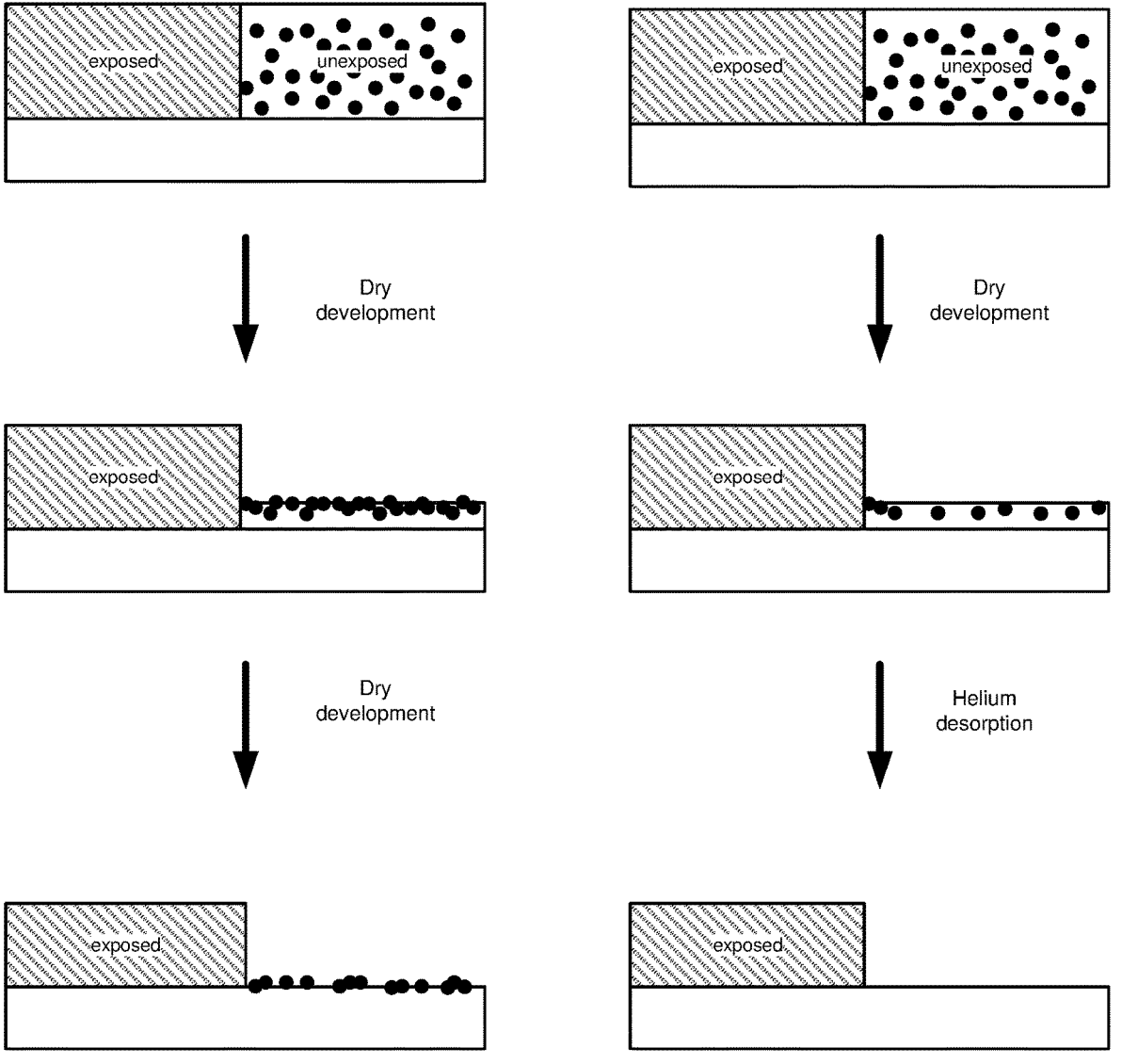
FIG. 4A                    FIG. 4B

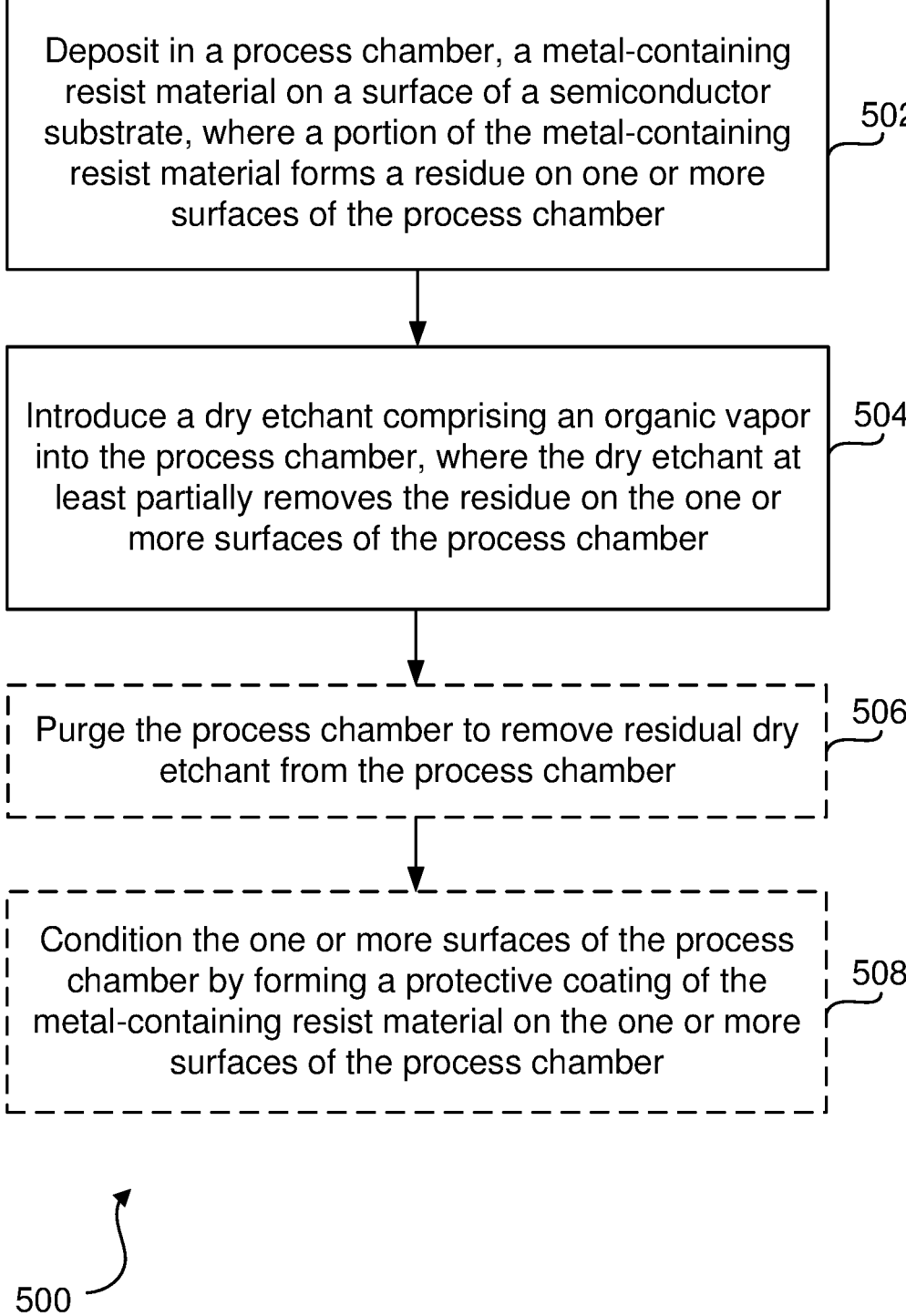

Deposit in a process chamber, a metal-containing resist material on a surface of a semiconductor substrate, where a portion of the metal-containing resist material forms a residue on one or more surfaces of the process chamber

502

Introduce a dry etchant comprising an organic vapor into the process chamber, where the dry etchant at least partially removes the residue on the one or more surfaces of the process chamber

504

Purge the process chamber to remove residual dry etchant from the process chamber

506

Condition the one or more surfaces of the process chamber by forming a protective coating of the metal-containing resist material on the one or more surfaces of the process chamber

PHOTORESIST DEVELOPMENT WITH ORGANIC VAPOR

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of atypical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Provided herein is a method of developing a photopatterned metal-containing resist. The method includes providing in a process chamber a photopatterned metal-containing resist on a surface of a semiconductor substrate, and dry developing the photopatterned metal-containing resist by selectively removing a portion of the resist by exposure to a development chemistry comprising an organic vapor to form a resist mask.

In some implementations, the organic vapor comprises a carboxylic acid. In some implementations, the organic vapor comprises trifluoroacetic acid. In some implementations, the organic vapor comprises trifluoroacetic acid anhydride, acetic acid anhydride, trichloroacetic acid, mono-fluoroacetic acid, di-fluoroacetic acid, chloro-difluoro-acetic acid, thioacetic acid, or thioglycolic acid. In some implementations, the organic vapor comprises hexafluoro-acetylacetone. In some implementations, the development chemistry comprises a mixture in a vapor phase of a halogenated carboxylic acid and a hydrogen halide. In some implementations, dry developing the photopatterned metal-containing resist comprises reacting the organic vapor with the photopatterned metal-containing resist to form a volatile compound at a temperature less than about 200° C. In some implementations, dry developing the photopatterned metal-containing resist comprises exposure to at least the organic vapor in a plasma-free thermal process. In some implementations, the photopatterned metal-containing resist is a photopatterned metal-containing EUV resist, where the photopatterned metal-containing EUV resist is an organo-metal oxide or organo-metal-containing film. In some implementations, dry developing the photopatterned metal-containing resist comprises selectively removing an EUV-unexposed portion of the resist relative to an EUV-exposed portion with the development chemistry to form the resist mask.

Also provided herein is a method of removing residue from one or more surfaces of a process chamber. The method includes depositing in a process chamber, a metal-containing resist material on a surface of a semiconductor substrate, where a portion of the metal-containing resist material forms a residue on one or more surfaces of the process chamber, and introducing a dry etchant comprising an organic vapor into the process chamber, where the dry etchant at least partially removes the residue on the one or more surfaces of the process chamber.

In some implementations, the organic vapor comprises a carboxylic acid. In some implementations, the organic vapor comprises trifluoroacetic acid. In some implementations, the organic vapor comprises trifluoroacetic acid anhydride, acetic acid anhydride, trichloroacetic acid, mono-fluoroacetic acid, di-fluoroacetic acid, chloro-difluoro-acetic acid, thioacetic acid, or thioglycolic acid. In some implementations, the organic vapor comprises hexafluoro-acetylacetone. In some implementations, the dry etchant comprises a mixture in a vapor phase of a halogenated carboxylic acid and a hydrogen halide. In some implementations, at least partial removal of the residue comprises reacting the organic vapor with the metal-containing resist material to form a volatile compound at a temperature less than about 200° C. In some implementations, at least partial removal of the residue comprises exposure to at least the organic vapor in a plasma-free thermal process. In some implementations, the metal-containing resist material is an organo-metal oxide or organo-metal-containing film. In some implementations, the method further includes purging the process chamber after introducing the dry etchant to remove residual dry etchant from the process chamber, and conditioning the one or more surfaces of the process chamber by forming a protective coating of the metal-containing resist material on the one or more surfaces of the process chamber.

BRIEF DESCRIPTION OF DRAWINGS

FIG. 4A shows cross-sectional schematic illustrations of dry development without applying inert gas plasma according to some implementations.

FIG. 4B shows cross-sectional schematic illustrations of dry development cycling inert gas plasma for descumming according to some implementations.

FIG. 5 presents a flow diagram of an example method of dry chamber cleaning according to some implementations.

DETAILED DESCRIPTION

Figure 1:
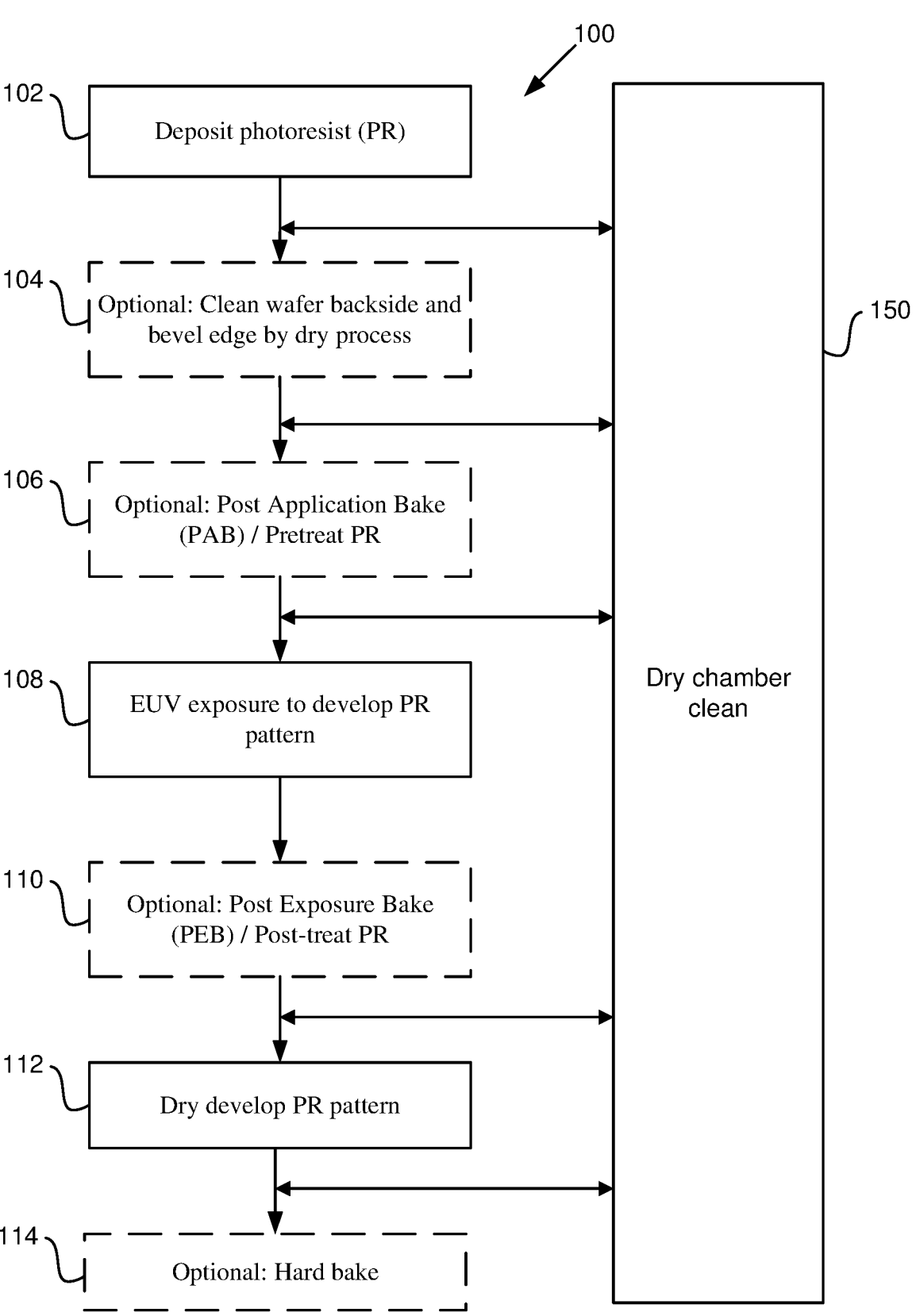
FIG. 1 presents a flow diagram of an example method for depositing and developing a photoresist according to some implementations.

This disclosure relates generally to the field of semiconductor processing. In particular aspects, the disclosure is directed to processes and apparatuses for development of photoresists (e.g., EUV-sensitive metal and/or metal oxide-containing photoresists) using organic vapors such as organic acids, for example to form a patterning mask in the context of EUV patterning or other wavelength patterning. While discussion below may be focused on EUV photoresists, it will be apparent that the photoresists discussed herein may also be appropriate for use with other wavelengths of radiation, and the techniques and apparatuses discussed herein are not limited solely to EUV photoresist manufacturing.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Introduction

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs is directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in International Patent Application No. PCT/US2019/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects and/or delamination.

Dry development techniques have been proposed to overcome these issues by eliminating substrate delamination and interface failures. Dry development can improve performance at narrower linewidths (e.g., prevent line collapse due to surface tension and delamination seen in wet development) and potentially enhance throughput (e.g., by avoiding need for wet development tracks). Other advantages may include eliminating the use of organic solvent developers, reduced sensitivity to underlayer adhesion, and a lack of solubility-based limitations. Dry development can also provide more tunability and give further critical dimension (CD) control and scum removal.

Dry development has its own challenges, including etch selectivity between unexposed and EUV exposed resist material which can lead to a higher dose to size requirement for effective resist exposure when compared to wet development. Suboptimal selectivity can also cause PR corner rounding due to lower contrast at feature edges which may increase line CD variation in the following transfer etch step. Dry Removal of Metal-Containing Resist According to various aspects of the present disclosure, a photopatterned metal-containing photoresist is developed by exposure to vapors of organic acids or other vapor phase precursors. An EUV-sensitive metal or metal oxide-containing film, e.g., an organotin oxide, is disposed on a semiconductor substrate. The EUV-sensitive metal or metal oxide-containing film is patterned directly by EUV exposure in vacuum ambient. A pattern is then developed to form a resist mask using a development chemistry. In some implementations, the development chemistry is a dry development chemistry. In some implementations, the dry development chemistry includes an organic vapor such as trifluoroacetic acid. Such dry development techniques may be done while using either a gentle plasma (high pressure, low power) or non-plasma thermal process while flowing an organic vapor. Additionally or alternatively, the present disclosure provides for dry chamber clean of EUV resist material or metal-containing resist material from internal surfaces of a process chamber by exposure to organic acids or other vapor phase precursors. In some implementations, the organic vapor is trifluoroacetic acid. The dry clean may be a non-plasma thermal-based clean operation. The dry chamber clean may be performed in any process chamber used in deposition, bevel edge and/or backside clean, bake, development, or etch operation.

Various implementations of the present disclosure may include combining all dry operations by vapor deposition, EUV lithographic patterning, and dry development. Various other implementations include a combination of wet and dry processing operations, for example, spin-on EUV photoresists (wet process) may be combined with dry development or other wet or dry processes as described herein. Also described are various post-deposition (or post-application) processes such as bevel and backside cleaning, chamber cleaning, descum, smoothing, curing to modify and enhance film characteristics, and photoresist rework processing.

FIG. 1 presents a flow diagram of an example method for depositing and developing a photoresist according to some implementations. The operations of a process 100 may be performed in different orders and/or with different, fewer, or additional operations. Aspects of the process 100 may be described with reference to FIGS. 2, 3A-3C, 4A-4B, 5, and 6A-6D. One or more operations of the process 100 may be performed using an apparatus described in any one of FIGS. 7-11B. In some implementations, the operations of the process 100 may be implemented, at least in part, according to software stored in one or more non-transitory computer readable media. In some implementations, dry chamber clean may be performed after deposition, backside and bevel edge clean, post application bake, post exposure bake, or dry development.

At block 102 of the process 100, a layer of photoresist is deposited. This may be either a dry deposition process such as a vapor deposition process or a wet process such as a spin-on deposition process.

The photoresist may be a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations (e.g., such as are available from Inpria Corp, Corvallis, OR) and formulations applied using dry vacuum deposition techniques, further described below.

Semiconductor substrates may include any material construct suitable for photolithographic processing, particularly for the production of integrated circuits and other semiconducting devices. In some implementations, semiconductor substrates are silicon wafers. Semiconductor substrates may be silicon wafers upon which features have been created ("underlying features"), having an irregular surface topography. As referred to herein, the "surface" is a surface onto which a film of the present disclosure is to be deposited or that is to be exposed to EUV during processing. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas.

These properties may be exploited in subsequent processing, such as to dissolve either unexposed or exposed areas, or to selectively deposit materials on either the exposed or unexposed areas. In some implementations, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various implementations, organometallic materials, for example organotin materials comprising tin oxide, or other metal oxide materials/moieties. The organometallic compounds may be made in a vapor phase reaction of an organometallic precursor with a counter reactant. In various implementations, the organometallic compounds are formed through mixing specific combinations of organometallic precursors having bulky alkyl groups or fluoroalkyl groups with counter-reactants and polymerizing the mixture in the vapor phase to produce a low-density, EUV-sensitive material that deposits onto the semiconductor substrate.

In various implementations, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_a R_b L_c \qquad \text{(Formula 1)}$$

wherein: M is an element with a high patterning radiation-absorption cross-section; R is alkyl, such as $C_n H_{2n+1}$, preferably wherein n=1-6; L is a ligand, ion or other moiety which is reactive with the counter-reactant; a≥1; b≥1; and c≥1. In various implementations, M has an atomic absorption cross section equal to or greater than $1 \times 10^7$ $cm^2$/mol. M may be, for example, selected from the group consisting of tin, hafnium, tellurium, bismuth, indium, antimony, iodine, germanium, and combinations thereof. In some implementations, M is tin. R may be fluorinated, e.g., having the formula $C_n F_x H_{(2n+1)}$. In various implementations, R has at least one beta-hydrogen or beta-fluorine. For example, R may be selected from the group consisting of methyl, ethyl, i-propyl, n-propyl, t-butyl, i-butyl, n-butyl, sec- butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethylamino) tin, sec-butyl tris(dimethylamino) tin, i-propyl(tris) dimethylamino tin, n-propyl tris(dimethylamino) tin, ethyl tris(dimethylamino) tin and analogous alkyl(tris)(t-butoxy) tin compounds such as t-butyl tris(t-butoxy) tin. In some implementations, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various implementations, a counter-reactant reacts with the organometallic precursor by forming oxygen bridges between neighboring metal atoms. Other potential counter-reactants include hydrogen sulfide and hydrogen disulfide, which can crosslink metal atoms via sulfur bridges.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some implementations, a gentle remote $H_2$ plasma may be introduced so as to replace some Sn—L bonds with Sn—H, which can increase reactivity of the resist under EUV.

In various implementations, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some implementations, more than one organometallic precursor is included in the vapor stream. In some implementations, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation).

The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various implementations, the steric hindrance of the bulky alkyl groups prevents the formation of densely packed network and produces smooth, amorphous, low-density films.

The CVD process is generally conducted at reduced pressures, such as from 10 milliTorr to 10 Torr. In some implementations, the process is conducted at from 0.5 to 2 Torr. In some implementations, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

In some implementations, the EUV-patternable films are made and deposited on the semiconductor substrate using wet deposition equipment and processes among those known in the art. For example, the organometallic material is formed by spin-coating on the surface of the semiconductor substrate.

The thickness of the EUV-patternable film formed on the surface of the semiconductor substrate may vary according to the surface characteristics, materials used, and processing conditions. In various implementations, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though insufficient cross-linking may cause the resist to be more prone to liftoff or collapse in wet development, such risk is not as present in dry development. An all-dry lithography approach may facilitate more efficient utilization of EUV photons by more opaque resist films. Though efficient utilization of EUV photons may occur with EUV-patternable films having higher overall absorption, it will be understood that in some instances, the EUV-patternable film may be less than about 30%. For comparison, the maximum overall absorption of most other resist films is less than 30% (e.g., 10% or less, or 5% or less) so that the resist material at the bottom of the resist film is sufficiently exposed. In some implementations, the film thickness is from 10 nm to 40 nm or from 10 nm to 20 nm. Without limiting the mechanism, function, or utility of the present disclosure, the processes of the present disclosure have few restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

In addition to depositing a metal-containing EUV resist thin film on a semiconductor substrate at block 102 of the process 100, some metal-containing EUV resist material may form as a residue on internal surfaces of the process chamber. The internal surfaces may include chamber walls, floors, and ceilings of the process chamber. Other internal surfaces may include a showerhead, nozzles, and substrate support surfaces. The metal-containing EUV resist material may form as a result of dry deposition processes, such as CVD or ALD processes. A thickness of the residue of the metal-containing EUV resist material may increase over time as a result of additional processing (e.g., deposition) operations being performed in the process chamber. The residue is prone to flake off, shed particles, or peel from the internal surfaces of the process chamber to cause contamination in downstream processes.

At block 150 of the process 100, a dry chamber clean is performed after deposition of the metal-containing EUV resist thin film at block 102 of the process 100. This allows for deposition and dry cleaning to be performed in the same process chamber. However, it will be understood that the dry chamber clean may be performed in a different process chamber than the deposition operation in some implementations. In fact, the dry chamber clean may be performed subsequent to a bevel edge and/or backside clean, bake, development, or etch operation, since residue may also form inside chambers where any of these operations are performed, which may or may not be the same as the deposition chamber.

The dry-deposited EUV resist materials being removed are generally composed of Sn, O, and C, but the same clean approaches can be extended to films of other metal oxide resists and materials. In addition, this approach can be used for film strip and photoresist rework.

At block 104, an optional cleaning process is performed to clean a backside and/or bevel edge of the semiconductor substrate. The backside and/or bevel edge clean may nonselectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning (scanner) and development tools. Conventionally, removal of this bevel edge and backside deposition is done by wet cleaning techniques. For spin-coated photoresist material, this process is called edge bead removal (EBR) and is performed by directing a stream of solvent from above and below the bevel edge while the substrate is spinning. The same process can be applied to soluble organotin oxide-based resists deposited by vapor deposition techniques.

The substrate bevel edge and/or backside clean may also be a dry clean process. In some implementations, the dry clean process involves a vapor and/or plasma having one or more of the following gases: HBr, HCl, $BCl_3$, $SOCl_2$, $Cl_2$, $BBr_3$, $H_2$, $O_2$, $PCl_3$, $CH_4$, methanol, ammonia, formic acid, $NF_3$, HF. In some implementations, the dry clean process may use the same chemistries as a dry development process described herein. For example, the bevel edge and/or backside clean may use an organic acid such as trifluoroacetic acid or other organic vapor. For the bevel edge and/or backside clean process, the vapor and/or the plasma has to be limited to a specific region of the substrate to ensure that only the backside and the bevel are removed, without any film degradation on a frontside of the substrate.

Process conditions may be optimized for bevel edge and/or backside clean. In some implementations, higher temperature, higher pressure, and/or higher reactant flow may lead to increased etch rate. Suitable process conditions for a dry bevel edge and backside clean may be: reactant flow of 100-10000 sccm (e.g., 500 sccm HCl, HBr, HI, or Hz and $Cl_2$ or $Br_2$, $BCl_3$ or Hz, or other halogen-containing compound), temperature of 20 to 140° C. (e.g., 80° C.), pressure of 20-1000 mTorr (e.g., 100 mTorr) or pressure of 50-765 Torr (e.g., 760 Torr), plasma power of 0 to 500 W at high frequency (e.g., 13.56 MHz), and for a time of about 10 to 20 seconds, dependent on the photoresist film and composition and properties. Bevel and/or backside clean may be accomplished using a Coronus® tool available from Lam Research Corporation, Fremont, CA, though a wider range of process conditions may be used according to the capabilities of the processing reactor.

Bevel edge and/or backside clean may alternatively be extended to a full photoresist removal or photoresist "rework" in which an applied EUV photoresist is removed and the semiconductor substrate prepared for photoresist reapplication, such as when the original photoresist is damaged or otherwise defective. Photoresist rework should be accomplished without damaging the underlying semiconductor substrate, so an oxygen-based etch should be avoided. Instead, organic vapor chemistries or variants of halogen-containing chemistries as described herein may be used. It will be understood that the photoresist rework operation may be applied at any stage during the process 100. Thus, the photoresist rework operation may be applied after deposition, after bevel edge and/or backside clean, after PAB treatment, after EUV exposure, after PEB treatment, after development, or after hard bake. In some implementations, the photoresist rework may be performed for non-selective removal of exposed and unexposed regions of the photoresist but selective to an underlayer.

In some implementations, the photoresist rework process involves a vapor and/or plasma having one or more of the following gases: HBr, HCl, HI, $BCl_3$, $Cl_2$, $BBr_3$, $H_2$, $PCl_3$, $CH_4$, methanol, ammonia, formic acid, $NF_3$, HF. In some implementations, the photoresist rework may use the same chemistries as a dry development process described herein. For example, the photoresist rework may use an organic acid such as trifluoroacetic acid or other organic vapor.

Process conditions may be optimized for the photoresist rework. In some implementations, higher temperature, higher pressure, and/or higher reactant flow may lead to increased etch rate. Suitable process conditions for a photoresist rework may be: reactant flow of 100-500 sccm (e.g., 500 sccm HCl, HBr, HI, $BCl_3$ or $H_2$ and $Cl_2$ or Bra), temperature of 20 to 140° C. (e.g., 80° C.), pressure of 20-1000 mTorr (e.g., 300 mTorr) or pressure of 50-765 Torr (e.g., 760 Torr), plasma power of 0 to 800 W (e.g., 500 W) at high frequency (e.g., 13.56 MHz), wafer bias of 0 to 200 $V_b$ (a higher bias may be used with harder underlying substrate materials) and for a time of about 20 seconds to 3 minutes, sufficient to completely remove the EUV photoresist, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

At block 150 of the process 100, a dry chamber clean operation may be performed after a bevel edge and/or backside clean at block 104 of the process 100. This allows for bevel edge and/or backside clean and dry chamber clean to be performed in the same process chamber. However, it will be understood that the dry chamber clean may be performed in a different process chamber than the bevel edge and/or backside clean in some implementations.

At block 106 of the process 100, an optional post-application bake (PAB) is performed after deposition of the metal-containing EUV resist film and prior to EUV exposure. The PAB treatment may involve a combination of thermal treatment, chemical exposure, and moisture to increase the EUV sensitivity of the metal-containing EUV resist film, reducing the EUV dose to develop a pattern in the metal-containing EUV resist film. The PAB treatment temperature may be tuned and optimized for increasing the sensitivity of the metal-containing EUV resist film. For example, the treatment temperature may be between about 90° C. and about 200° C. or between about 150° C. and about 190° C. In some implementations, the PAB treatment may be conducted with a pressure between atmospheric and vacuum, and a treatment duration of about 1 to 15 minutes, for example about 2 minutes. In some implementations, the PAB treatment is conducted at a temperature between about 100° C. to 230° C. for about 1 minute to 2 minutes.

At block 150 of the process 100, a dry chamber clean operation may be performed after the PAB treatment at block 106 of the process 100. This allows for bake and dry chamber clean to be performed in the same process chamber. However, it will be understood that the dry chamber clean may be performed in a different process chamber than the PAB treatment in some implementations.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. This can also be explained as weaker Sn—C bonding with more branching. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a dry method to form a metal oxide-containing mask.

In particular, in various implementations, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 mJ/cm² to 100 mJ/cm² results in the cleavage of Sn—C bonds resulting is loss of the alkyl substituent, alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

At block 110 of the process 100, an optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions or simply baked on a hot plate in ambient air, for example between 100° C. and 250° C. for between one and five minutes (e.g., 190° C. for two minutes).

In various implementations, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely crosslinked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 200° C. and about 240° C. In some implementations, the PEB treatment may be conducted with a pressure between atmospheric and vacuum, and a treatment duration of about 1 to 15 minutes, for example about 2 minutes. In some implementations, PEB thermal treatment may be repeated to further increase etch selectivity.

At block 150 of the process 100, a dry chamber clean operation may be performed after the PEB treatment at block 110 of the process 100. This allows for bake and dry chamber clean to be performed in the same process chamber. However, it will be understood that the dry chamber clean may be performed in a different process chamber than the PEB treatment in some implementations.

At block 112 of the process 100, the photopatterned metal-containing EUV resist is developed to form a resist mask. In various implementations, the exposed regions are removed (positive tone) or the unexposed regions are removed (negative tone). In some implementations, development may include selective deposition on either the exposed or unexposed regions of the photopatterned metal-containing EUV resist, followed by an etching operation. In some implementations, development may be done with exposure to one or more organic vapors (e.g., trifluoroacetic acid). The development may be done without striking a plasma in some implementations. Or, development may be done with flows of one or more organic vapors (e.g., trifluoroacetic acid) activated in a remote plasma source or activated by exposure to remote UV radiation. The photoresist for development may include an element selected from the group consisting of: tin, hafnium, tellurium, bismuth, indium, antimony, iodine, and germanium. The element may have a high patterning radiation-absorption cross-section. In some implementations, the element may have a high EUV-absorption cross-section. In some implementations, the metal-containing EUV resist may have an overall absorption greater than 30%. In an all-dry lithography process, this provides more efficient utilization of EUV photons, enabling development of thicker and more EUV-opaque resists.

Examples of processes for development involve an organotin oxide-containing EUV-sensitive photoresist thin film (e.g., 10-30 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix.

At block 150 of the process 100, a dry chamber clean may be performed after dry development at block 112 of the process 100. This allows for dry development and dry chamber clean to be performed in the same process chamber. However, it will be understood that the dry chamber clean may be performed in a different process chamber than the dry development in some implementations. Moreover, it will be understood that the dry chamber clean may be performed in the same or different process chamber than an etch operation. The etch operation may be applied to etch a substrate underlayer of the semiconductor substrate.

At block 114 of the process 100, the semiconductor substrate optionally undergoes a hard bake. During the hard bake, the semiconductor substrate is subjected to an elevated temperature. For example, the semiconductor substrate may be subjected to an elevated temperature equal to or greater than about 50° C., between about 100° C. and about 300° C., or between about 170° C. and about 290° C. The hard bake may drive out remaining solvents or etch gas from development.

Figure 2:
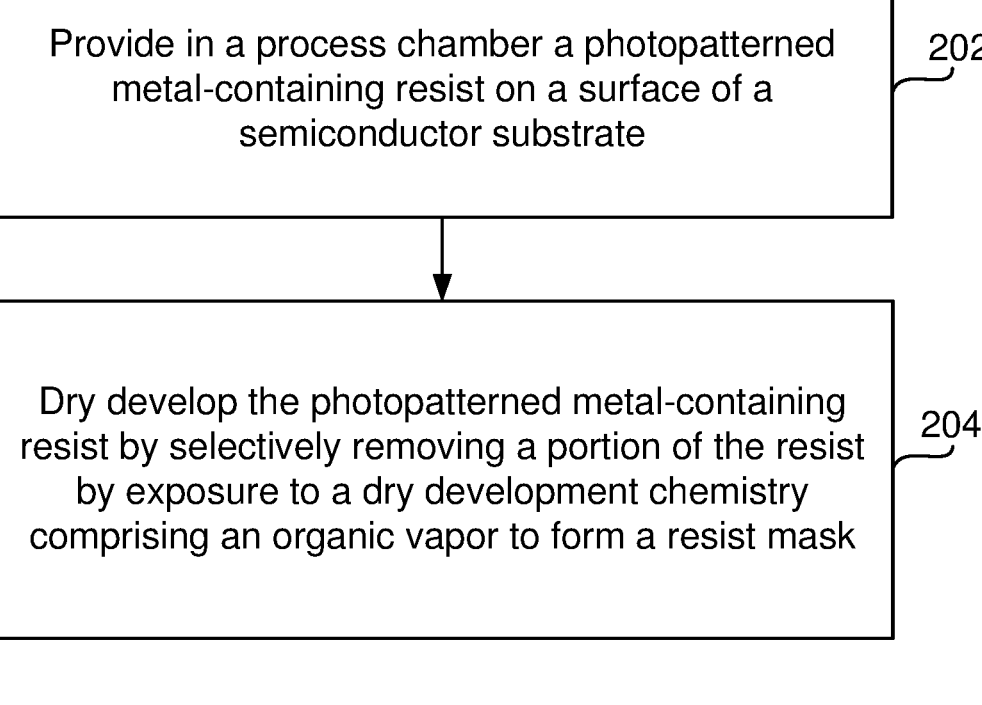
FIG. 2 presents a flow diagram of an example method of dry developing a metal-containing resist according to some implementations.

FIG. 2 presents a flow diagram of an example method of dry developing a metal-containing resist according to some implementations. The operations of a process 200 may be performed in different orders and/or with different, fewer, or additional operations. Aspects of the process 200 may be described with reference to FIGS. 3A-3C and FIGS. 4A-4B. One or more operations of the process 200 may be performed using an apparatus described in any one of FIGS. 7-11B. In some implementations, the operations of the process 200 may be implemented, at least in part, according to software stored in one or more non-transitory computer readable media.

At block 202 of the process 200, a photopatterned metal-containing resist is provided on a surface of a semiconductor substrate in a process chamber. A metal-containing resist may be deposited on the surface of the semiconductor substrate. The metal-containing resist may be exposed to UV radiation (e.g., EUV radiation) by a scanner or EUV lithography tool to form the photopatterned metal-containing resist. In some implementations, the photopatterned metal-containing resist is a photopatterned metal-containing EUV resist. For example, the photopatterned metal-containing EUV resist is an organo-metal oxide or organo-metal-containing film. The semiconductor substrate may be provided in the process chamber after processing in the scanner and/or PEB treatment chamber.

At block 204 of the process 200, the photopatterned metal-containing resist is dry developed to selectively remove a portion of the resist by exposure to a development chemistry comprising an organic vapor to form a resist mask. Dry developing the photopatterned metal-containing resist includes selectively removing an EUV-unexposed portion of the resist relative to an EUV-exposed portion with the development chemistry to form the resist mask. Typically, development occurs using a wet development chemistry. Wet development using a solvent produces an undesirable waste stream. Wet development generally involves moisture and/or oxygen, which more easily leads to scum formation. Wet development is limited by solubility and cluster size, whereas dry development is not limited by solubility and cluster size. Wet development is more prone to pattern collapse and delamination issues that dry development avoids. Development in the present disclosure occurs in the vapor phase using a dry development chemistry instead of wet development chemistry.

Development using dry development chemistry ordinarily involves vapors of halogens such as a vapor of boron trichloride ($BCl_3$), hydrogen gas ($H_2$) mixed with chlorine gas ($Cl_2$) or bromine gas ($Br_2$), or a vapor of a hydrogen halide such as hydrogen bromide (HBr), hydrogen chloride (HCl), or hydrogen fluoride (HF). However, such vapors may leave a residue or scum after development. The residue may include residual etch byproduct adsorbed onto the surface of the semiconductor substrate or even onto chamber walls. For example, the vapors of halogens may react with moisture or oxygen to forming residual etch byproducts that are difficult to remove. In some instances, the residual etch byproduct includes bromides that are sticky and resistant to removal. Buildup of residual etch byproducts can lead to process drift, resulting in hazard precautions in the process chamber. Moreover, residue adsorbed on the semiconductor substrate has the potential to desorb off the semiconductor substrate and contaminate downstream processing tools. In some cases, the residue may include high metal concentrations or clusters of metal oxide that can contaminate downstream processing tools. And because the residual etch byproduct is difficult to remove and not readily volatile, a separate plasma step or separate chamber with plasma capability may be necessary. Otherwise, high temperature swings are performed to cause the residue to volatilize, which is often undesirable for the semiconductor substrate and process chamber.

The development chemistry of the present disclosure is an organic vapor. The organic vapor may be an organic acid. In some implementations, the organic acid includes a carboxylic acid. In some implementations, the organic acid includes trifluoroacetic acid ($CF_3COOH$). The organic vapor may be halogenated or at least fluorinated. In some implementations, the organic vapor includes hexafluoro-acetylacetone ($CF_3CCH_2CCF_3$). In some implementations, the organic vapor includes trifluoroacetic acid anhydride (($CF_3CO)_2O$), acetic acid anhydride (($CH_3CO)_2O$), trichloroacetic acid ($CCl_3COOH$), mono-fluoroacetic acid ($CFH_2COOH$), di-fluoroacetic acid ($CF_2HCOOH$), a mixed halide acetic acid such as chloro-difluoro-acetic acid, a sulfur-containing analogue of acetic acid, thioacetic acid ($CH_3COSH$), or thioglycolic acid ($HSCH_2CO_2H$). In some implementations, the development chemistry includes a mixture of a carboxylic acid and a hydrogen halide in a vapor phase. For example, the development chemistry includes a mixture of acetic acid or formic acid with hydrogen chloride or hydrogen bromide. In some implementations, the organic vapor may be flowed with or without inert/carrier gas such as helium (He), neon (Ne), argon (Ar), xenon (Xe), and nitrogen ($N_2$).

The organic vapor may react with the metal-containing resist to form byproducts that are more volatile than the etch byproducts formed from vapors of halogens. By way of an example, it is possible that etch byproducts of tin bromides may have a boiling point equal to or greater than about 200° C. However, etch byproducts of tin fluoroacetates may be less than about 200° C. For example, hexatin(II)-di-µ-oxy-octakis-µ-trifluoroacetate (1F) is volatile at 191° C. at 1 Torr and tin(IV) tetrakis(trifluoroacetate) (2F) is volatile at 84° C. at 1 Torr. Both 1F and 2F provide high thermal stability and volatility. Etch byproducts formed from organic vapors reacting with metal-containing resist may have excellent volatility. In particular, etch byproducts formed from trifluoroacetic acid reacting with EUV-unexposed organometallic resist may have excellent volatility. Without being limited by any theory, trifluoroacetic acid or other fluorinated derivatives of organic acids may increase the volatility of etch byproducts with their electron-drawing effect. Trifluoroacetic acids or other fluorinated derivatives of organic acids may be strong organic acids.

The organic vapor of the present disclosure may be a strong organic acid. As used herein, a strong organic acid may have a $pK_a$ value that is equal to or less than about 3.8. The strength of the organic acid may be increased by halogenation. In some implementations, the strength of the organic acid may be significantly increased by fluorination. For example, though formic acid or acetic acid may etch metal-containing resist materials such as organometallic resist materials, trifluoroacetic acid can more effectively etch such metal-containing resist materials. Whereas less strong organic acids (e.g., acetic acid) may be assisted by plasma for selective removal of metal-containing resist materials, stronger organic acids may selectively remove the metal-containing resist materials without the assistance of plasma. Accordingly, dry development of the metal-containing resist may be performed without the assistance of plasma in the present disclosure. However, as described below, plasma may optionally be employed in a desorption, descumming, or smoothing operation after dry development. This plasma-based desorption, descumming, or smoothing operation may be unnecessary where the etch byproducts of the organic vapors are volatilized.

Organic vapors of the present disclosure may perform dry development in a plasma-free thermal process. This means that dry development may be performed in a process chamber without plasma capability. In some implementations, dry development may be performed without a subsequent plasma-based descumming or smoothing operation. By eliminating plasma exposure, this avoids plasma damage to the semiconductor substrate and can significantly reduce cost and increase throughput. Furthermore, internal surfaces of the process chamber may be made of a material that does not have to be resistant to plasma as well as resistant to vapors of halogens such as hydrogen halides. Chamber walls, ceilings, and surfaces of chamber components such as showerheads may be vulnerable to corrosion in the presence of moisture and vapors of halogens. As a result, the internal surfaces of the process chamber are typically composed of materials that are stable in plasma, vapors of halogens, and water vapor. However, for dry development chemistries of the present disclosure such as trifluoroacetic acid, internal surfaces of the process chamber in the present disclosure may be composed of materials that do not necessarily meet the aforementioned requirements. In some implementations, chamber walls of the process chamber may include aluminum oxide, anodized aluminum, or plastic.

By applying a plasma-free thermal approach, productivity can be significantly improved as multiple wafers can be batch developed, at the same time in a low-cost thermal vacuum chamber/oven. However, in some implementations, the thermal dry development process may be followed by exposure to plasma. Subsequent exposure to plasma may occur for desorption, descumming, smoothing, or other processing operations.

Dry development of the photopatterned metal-containing resist may be combined with other dry processing operations such as dry deposition (e.g., CVD) of the metal-containing resist. In some implementations, processing of the semiconductor substrate may combine all dry steps including film formation by vapor deposition, EUV lithographic patterning, and dry development. Bake operations, bevel edge and/or backside clean operations, and chamber clean operations may also be dry operations. Such processing operations may avoid material and productivity costs associated with wet processing operations such as wet development. Furthermore, dry processing can provide more tunability and add further critical dimension (CD) control and possible scum removal. In general, wet processing involves moisture and/or oxygen, which more easily leads to scum formation. Wet development is limited by solubility and cluster size, whereas dry development is not limited by solubility and cluster size. Wet development is more prone to pattern collapse and delamination issues that dry development avoids. In addition, employing all-dry processing operations may facilitate integration within an interconnected vacuum processing chamber without exposure to and contamination by ambient air or trace contaminants contained therein. For example, the PEB thermal treatment during which exposed regions undergo further crosslinking may be conducted in the same chamber as development, though it will be understood that the PEB thermal treatment may be performed in another chamber.

In some implementations, dry development can be done by using a thermal process while flowing the organic vapor such as trifluoroacetic acid. For example, dry development can be carried out in a thermal processing chamber. In some implementations, the organic vapor such as trifluoroacetic acid is able to quickly remove the unexposed portions of the photopatterned metal-containing resist relative to the exposed portions of the photopatterned metal-containing resist, leaving behind a pattern of exposed film that can be transferred to underlying layers of the semiconductor substrate by an etch process.

In some implementations, the semiconductor substrate may be exposed to dry development chemistry such as a strong organic acid in a thermal processing chamber such as an oven. The thermal processing chamber may include a development chemistry line for delivery of the organic vapor into the thermal processing chamber. In some implementations, the thermal processing chamber may include one or more heating elements for temperature control, such as heating elements coupled to a heating assembly facing the semiconductor substrate in the process chamber for substrate temperature control. In some implementations, the one or more heating elements may be one or more LEDs. The one or more heaters may heat the semiconductor substrate to an elevated temperature during dry development to promote volatilization of etch byproducts.

In thermal dry development processes, the photopatterned metal-containing resist is exposed to development chemistry that is optimized for etch selectivity between exposed and unexposed regions. Generally, lower temperatures may increase contrast in etch selectivity while higher temperatures may decrease contrast in etch selectivity. Higher temperatures may increase volatilization of etch byproducts to limit residue formation on the semiconductor substrate. In some implementations, a temperature may be less than about 200° C., between about 20° C. and about 190° C., between about 40° C. and about 120° C., or between about 50° C. and about 100° C. Reacting the photopatterned metal-containing resist with the organic vapor forms a volatile compound at a temperature less than about 200° C.

Chamber pressure may be tuned, where chamber pressure may influence etch selectivity between exposed and unexposed regions during thermal dry development. In some implementations, chamber pressure may be relatively low and accompanied without dilution, where the chamber pressure may be between about 0.1 mTorr and about 1000 mTorr, between about 0.2 mTorr and about 300 mTorr, or between about 0.5 mTorr and about 100 mTorr. In some implementations, the chamber pressure may be between about 20 mTorr and about 2000 mTorr, or between about 20 mTorr and about 1000 mTorr, such as about 300 mTorr. In some implementations, the chamber pressure may be relatively high with high flow and accompanied by dilution, where the chamber pressure may be between about 100 Torr and about 765 Torr or between about 200 Torr and about 760 Torr.

Gas flow rate of the dry development chemistry may be tuned, where gas flow may influence etch selectivity between exposed and unexposed regions during thermal dry development. In some implementations, gas flow may be between about 0.5 SLM and about 30 SLM, between about 1 SLM and about 20 SLM, or between about 2 SLM and about 15 SLM. The gas flow rate may include a total flow rate of gases flowed, including the organic vapor and carrier gas such as nitrogen, argon, etc. The organic vapor flow rate may only be a fraction of the total flow rate, where organic vapor flow rate may be between about 0.01 SLM and about 1 SLM. In instances with high flow, organic vapor flow may be between about 1 SLM and about 10 SLM.

Duration of exposure may be tuned in the thermal dry development process. The duration of exposure may depend on how much resist is desired to be removed, development chemistry, amount of crosslinking in the resist, and composition and properties of the resist, among other factors. In some implementations, duration of exposure may be between about 5 seconds and about 5 minutes, between about 10 seconds and about 3 minutes, or between about 10 seconds and about 1 minute.

In some implementations, the photopatterned metal-containing resist is developed in a plasma-free thermal approach. In alternative implementations, the photopatterned metal-containing resist is developed in a plasma development process. The photopatterned metal-containing resist is exposed to development chemistry including radicals/ions of one or more gases. The one or more gases may include an organic vapor such as trifluoroacetic acid. A process chamber for processing the semiconductor substrate for dry development may be a plasma-generating chamber or coupled to a plasma-generating chamber remote from the process chamber. The plasma-generating chamber may be an inductively-coupled plasma (ICP) reactor, transformer-coupled plasma (TCP) reactor, or capacitively-coupled plasma (CCP) reactor, employing equipment and techniques among those known in the art. An electromagnetic field acts on the one or more gases to produce a plasma in the plasma-generating chamber. Ions and/or radicals from the remote plasma may interact with the photopatterned metal-containing resist. The ions and/or radicals may include ions and/or radicals of an organic acid such as trifluoroacetic acid. In some implementations, a vacuum line is coupled to the process chamber for pressure control, and a development chemistry line may be coupled to the plasma-generating chamber for delivery of the one or more gases into the plasma-generating chamber. The process chamber may include one or more heaters for temperature control, such as heaters coupled to a heating assembly facing the substrate for substrate temperature control. In some implementations, development of the photopatterned metal-containing resist is exposed to conditions optimized for generating a gentle plasma characterized by high pressure and low power. In some implementations, RF power levels may be tuned, where RF power may be equal to or less than about 1000 W, equal to or less than about 800 W, or equal to or less than about 500 W.

In addition or in the alternative to plasma activation, activation of the one or more gases in a dry development process may occur by photoactivation. In some implementations, the photoactivation may be achieved by exposure to ultraviolet (UV) radiation. For example, the process chamber may include a lamp such as a UV lamp configured to generate UV radiation. Exposing the one or more gases to UV radiation may generate radicals of the one or more gases that can be used in dry development of the photopatterned metal-containing resist. Exposure of the one or more gases to UV radiation may occur in a manner without exposing the photopatterned metal-containing resist to UV radiation. In other words, the photopatterned metal-containing resist is out-of-sight with respect to the UV lamp.

It will be understood that the aforementioned methods of thermal development, plasma development, and photoactivation development may be combined together. Such development methods may be applied simultaneously or sequentially. The one or more development methods may be applied while flowing dry development chemistry in the vapor phase. The development can result in a positive or a negative tone, in which the dry development chemistry selectively removes either the unexposed or the exposed material, leaving behind the exposed or unexposed counterpart as a mask.

As described above, etch selectivity during dry development is tunable by controlling process conditions such as temperature, pressure, gas flow, gas composition, and plasma power, among other tunable process conditions. Tuning etch selectivity in a single step or multiple steps may achieve desired patterned characteristics. In some implementations, etch selectivity during dry development is tuned across one or more steps to influence resist profile. More specifically, the amount of taper or a re-entrant angle in the resist profile can be controlled by applying dry development chemistry of different etch selectivity over one or more steps. Descumming, photoresist reworking, curing, smoothing, and cleaning operations may also be tuned according to a tunable etch selectivity.

Figures 3A, 3B, 3C:
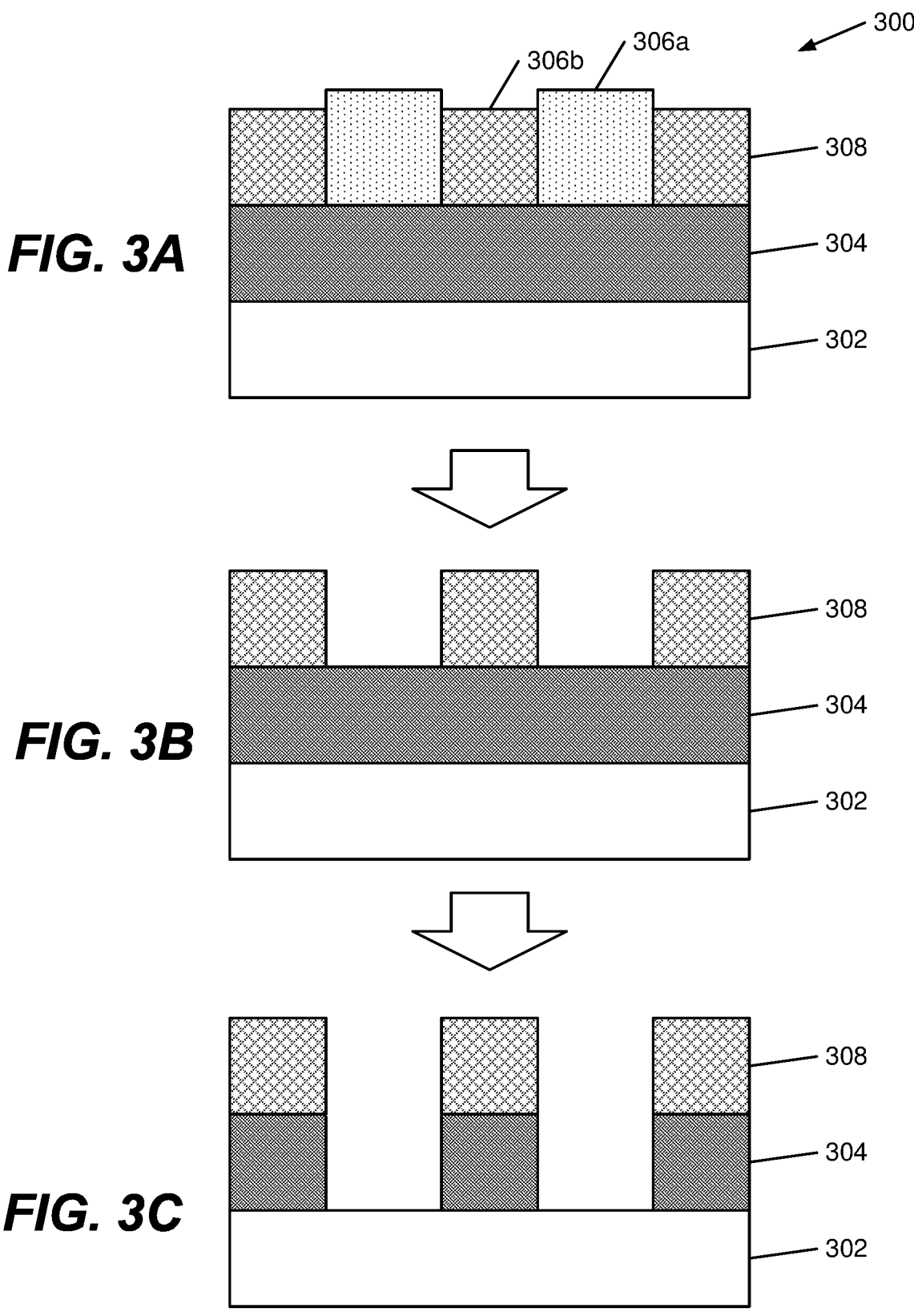
FIGS. 3A-3C show cross-sectional schematic illustrations of various processing stages of dry development according to some implementations.

FIGS. 3A-3C show cross-sectional schematic illustrations of various processing stages of dry development according to some implementations. The example shown in FIGS. 3A-3C illustrates negative tone dry development. As shown in FIG. 3A, a wafer 300 includes a substrate 302 and a substrate layer 304 to be etched. In some implementations, the substrate layer 304 includes an ashable hard mask such as spin-on carbon (SoC) or other material, e.g., silicon, silicon oxide, silicon nitride, silicon carbide, etc. In some implementations, the substrate layer 304 may be a layer stack disposed on the substrate 302. The wafer 300 further includes a photopatterned metal-containing EUV resist film 306. For example, the photopatterned metal-containing EUV resist film 306 may be an organo-metal-containing layer disposed on the substrate layer 304 to be etched. The photopatterned metal-containing EUV resist film 306 may have a thickness between about 5 nm and about 50 nm or between about 10 nm and about 30 nm. The photopatterned metal-containing EUV resist film 306 may be provided in a process chamber after photopatterning in an EUV scanner and/or after a PEB treatment as described above. The photopatterned metal-containing EUV resist film 306 includes non-EUV exposed regions 306a and EUV exposed regions 306b. As shown in FIG. 3B, the non-EUV exposed regions 306a of the photopatterned metal-containing EUV resist film 306 can be removed in a dry development process by exposure to flows of dry development chemistry without striking a plasma. The dry development chemistry may include an organic vapor such as an organic acid. The organic acid may include a halogenated or fluorinated carboxylic acid. Examples of organic acids include but are not limited to trifluoroacetic acid, hexafluoro-acetylacetone, trichloroacetic acid, mono-fluoroacetic acid, and di-fluoroacetic acid. Other examples of organic acids include a mixed halide acetic acid such as chloro-difluoro-acetic acid, a sulfur-containing analogue of acetic acid, thioacetic acid, and thioglycolic acid. A resist mask 308 is formed after development by removal of the non-EUV exposed regions 306a. Thereafter, the substrate layer 304 to be etched may be etched using the resist mask 308 to provide the structure depicted in FIG. 3C.

An organo-metal-oxide film may have a tetrahedrally coordinated structure. Exposed regions have higher levels of Sn—O—Sn crosslinking, resulting in higher density and lower/slower reactivity with halogenated carboxylic acids. Unexposed regions exhibit lower density due to the presence of bulky alkyl substituents which block the close approach and condensation of Sn—OH moieties. In unexposed regions, an acid such as trifluoroacetic acid more readily protonates more "basic" and accessible oxygen lone pairs characteristic of more tetrahedral-coordinated organotin oxide hydroxides. Volatile byproducts of trifluoroacetates are generated and removed from the unexposed regions.

Without being limited by any theory, trifluoroacetic acid may selectively protonate an oxygen lone pair to form a volatile byproduct. When the alkyl group is iso-propyl, at typical EUV patterning doses, at least 2 out of every 3 isopropyl substituents are removed, such that after a PEB step exposed areas condense to form a higher density more $SnO_2$ like material exhibiting lower reactivity with trifluoroacetic acid due to adoption of a more hexacoordinate tin structure in which oxygen atoms are less accessible, resulting in much slower reactivity with trifluoroacetic acid.

In some instances, there may be residue or scum remaining after development. Residue may result from slower etching components in less homogeneous EUV resist formulations, including those applied by spin-coating techniques. Such scum may contain high metal concentrations, which may be problematic during subsequent pattern transfer.

Additionally or alternatively, roughness may form after development on sidewalls of etched features in a developed pattern. Some of this may be attributed to stochastics or non-optimal Gaussian distribution of the light resulting in partially or fully exposed material in areas where the resist should remain unexposed or vice versa.

In some implementations, dry development may be accompanied by a descum/smoothing operation. In some implementations, a descumming and smoothing operation may be an inert gas plasma desorption operation. For example, the inert gas plasma desorption operation may be a helium plasma desorption operation. The inert gas plasma desorption operation may be performed after dry development or cycled with dry development.

FIG. 4A shows cross-sectional schematic illustrations of dry development without applying inert gas plasma according to some implementations. A photopatterned metal-containing EUV resist film includes exposed and unexposed regions. As shown in FIG. 4A, particles or clusters of metal oxide (e.g., $SnO_x$) may occupy the unexposed regions. As dry development proceeds, the clusters of metal oxide become more concentrated. Clusters of metal oxide are generally difficult to remove. Development may be selective for removal of organic material. After removal of the unexposed regions, the clusters of metal oxide may remain on a surface of the substrate as scum. Clusters of metal oxide that remain on sidewalls of the exposed regions may lead to roughness.

FIG. 4B shows cross-sectional schematic illustrations of dry development cycling inert gas plasma for descumming according to some implementations. A first phase involves dry development to remove a substantial portion of the unexposed regions of the photopatterned metal-containing EUV resist film. The dry development chemistry may include, for example, an organic acid and/or hydrogen halide. A substantial portion may represent at least more than 70 volume % of the unexposed regions, more than 80 volume % of the unexposed regions, or more than 90 volume % of the unexposed regions. Clusters of metal oxide concentrate at a surface of the remaining unexposed regions of the EUV resist film. A second phase involves applying an inert gas plasma like helium plasma with low power and high ion energy for a short duration. The helium plasma removes the clusters of metal oxides. In addition, the helium plasma removes clusters from sidewalls and smooths the sidewalls. Helium plasma treatment may also serve to help harden or cure the patterned EUV resist film to form a denser metal oxide like hard mask. After the helium plasma treatment, a less selective dry etch step can be employed to remove any residue remaining in unexposed regions of the EUV resist film.

In some implementations, dry development may cycle with helium plasma treatment across one or more cycles until the unexposed regions of the EUV resist film are removed. The helium plasma descum/smoothing may be cycled with dry development, as described above, for enhanced results. In this way, most of the organic component of the unexposed regions, for example, of the pattern is removed by the dry development, then a short helium plasma operation can remove some of the concentrated metal at the surface, opening up access to the remaining underlying organic material, that can then be removed in a subsequent dry development operation/cycle. Another cycle of helium plasma may be used to remove any remaining metal to leave a clean and smooth feature surface. The cycling can be continued until all or substantially all the scum and roughness residue is removed to leave a clean and smooth feature surface.

Process conditions for a descumming and smoothing operations may be controlled during or after development. In some implementations, reactant flow may be between about 50 sccm and about 1000 sccm or between about 100 sccm and about 500 sccm, such as about 500 sccm He. In some implementations, a temperature may be between about −60° C. and about 120° C., between about −20° C. and about 60° C., or between about 20° C. and about 40° C., such as about 20° C. In some implementations, chamber pressure may be between about 1 mTorr and about 300 mTorr, between about 5 mTorr and about 100 mTorr, between about 5 mTorr and about 20 mTorr, such as about mTorr. The plasma power may be relatively low with high ion energy. In some implementations, plasma power may be between about 50 W and about 1000 W, between about 100 W and about 500 W, or between about 100 W and about 300 W, such as about 300 W. In some implementations, the wafer bias is between about 10 V and about 500 V, between about 50 V and about 300 V, such as about 200 V. The plasma may be generated using a high RF frequency. In some implementations, the RF frequency is 13.56 MHz. The duration of exposure to inert gas plasma may be relatively short so as to avoid excess exposure to UV radiation during plasma exposure. In some implementations, the duration of exposure is between about 0.5 seconds and about 5 seconds, between about 1 second and about 3 seconds, such as about 2 seconds.

The inert gas plasma treatment for descumming and cleaning of the unexposed resist residue can have the collateral benefit of curing the exposed resist to harden it, thereby enhancing its hard mask function in subsequent operations to etch the underlying substrate. This resist hardening is achieved by exposure of the EUV exposed resist to UV radiation generated by the inert gas plasma, which may be continued after the descum/smoothing is complete with the bias turned off. The inert gas plasma curing may alternatively be performed if no descum/smoothing is needed or performed.

Not only can organic vapors of the present disclosure be employed in dry development processes, organic vapors such as trifluoroacetic acid may be employed in dry chamber clean or other processing operations for dry removal of metal-containing resist.

FIG. 5 presents a flow diagram of an example method of dry chamber cleaning according to some implementations. Dry chamber clean may be performed after deposition, bevel and/or backside clean, bake, development, or etch. In some implementations, dry chamber clean may be performed after deposition of resist material and in the same process chamber as deposition of the resist material. The operations of a process 500 may be performed in different orders and/or with different, fewer, or additional operations. Aspects of the process 500 may be described with reference to FIGS. 6A-6D. One or more operations of the process 200 may be performed using an apparatus described in any one of FIGS. 7-11B. In some implementations, the operations of the process 500 may be implemented, at least in part, according to software stored in one or more non-transitory computer readable media.

At block 502 of the process 500, a metal-containing resist material is deposited on a surface of a semiconductor substrate in a process chamber, where a portion of the metal-containing resist material forms a residue on one or more surfaces of the process chamber. The composition and deposition of such metal-containing resist material may be described, for example, in International Patent Application No. PCT/US2019/31618, filed May 9, 2019, incorporated by reference herein for the disclosure of the methods and materials applicable to the present disclosure. Methods include those where polymerized organometallic materials are produced in the vapor phase and deposited on the semiconductor substrate. In some implementations, the metal-containing resist material is a metal oxide-containing EUV resist material. For example, an element in the metal-containing resist material is selected from a group consisting of: tin, hafnium, tellurium, bismuth, indium, antimony, iodine, germanium, and combinations thereof. In some implementations, the metal-containing resist material includes organo-metal oxides such as organotin oxides.

In some implementations, the process chamber in which the semiconductor substrate is provided may be a dry deposition chamber. In other implementations, the process chamber in which the semiconductor substrate is provided in may be a bevel edge and/or backside clean chamber, PAB treatment chamber, PEB treatment chamber, development chamber, or etch chamber. Any of the foregoing chambers may accumulate metal-containing resist material on internal surfaces over time. As more and more semiconductor substrates are processed in a process chamber, unintended metal-containing resist material may grow on the internal surfaces as residue. Periodic cleaning is needed to remove the unintended deposits of the metal-containing resist material. The cleaning may be performed "in situ," where the dry chamber clean is performed in the same process chamber where unintended metal-containing resist material formed.

The residue may be formed on one or more surfaces of the process chamber, where the one or more surfaces may include one or more of chamber walls, ceilings, floors, showerhead surfaces, nozzle surfaces, and substrate support surfaces. In some implementations, the residue may form as a result of dry deposition processes such as CVD or ALD processes. A thickness of the residue on the one or more surfaces may increase over time as a result of additional processing (e.g., deposition) operations being performed in the process chamber. In some implementations, an average thickness of the residue is equal to or greater than about 2 nm, equal to or greater than about 3 nm, equal to or greater than about 5 nm, or equal to or greater than about 10 nm. The metal-containing resist material is prone to flake off, shed particles, or peel from the one or more surfaces to contaminate subsequent semiconductor substrates during processing.

Figure 6A:
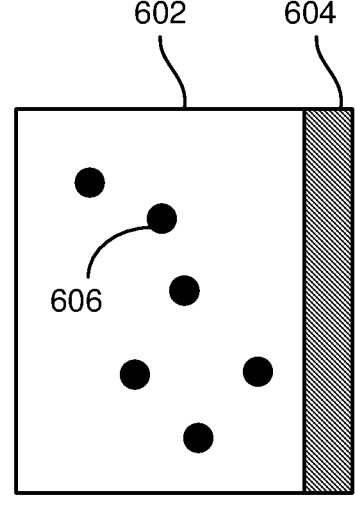
FIGS. 6A-6D show cross-sectional schematic illustrations of various processing stages of dry chamber cleaning according to some implementations.

FIG. 6A shows a cross-sectional schematic illustration of a metal-containing EUV resist material 602 formed on chamber walls 604 of a process chamber. The metal-containing EUV resist material 602 may include particles or clusters of metal oxide 606. Particles or clusters of metal oxide 606 may be difficult to remove. In some implementations, the metal-containing EUV resist material 602 is formed by vapor deposition methods such as CVD or ALD. Over time, the metal-containing EUV resist material 602 may accumulate in thickness on the chamber walls 604 of the process chamber. The metal-containing EUV resist material 602 may be an organotin oxide. The particles or clusters of metal oxide 606 may include tin oxide.

Returning to FIG. 5, at block 504 of the process 500, a dry etchant comprising an organic vapor is introduced into the process chamber, where the dry etchant at least partially removes the residue on the one or more surfaces of the process chamber. In some implementations, the organic vapor is an organic acid. The organic acid may be a strong organic acid having a $pK_a$ that is equal to or less than about 3.8. In some implementations, the organic acid includes a carboxylic acid. In some implementations, the organic acid includes trifluoroacetic acid. The organic vapor may be halogenated or at least fluorinated. In some implementations, the organic vapor includes hexafluoro-acetylacetone. In some implementations, the organic vapor includes trifluoroacetic acid anhydride, acetic acid anhydride, trichloroacetic acid, mono-fluoroacetic acid, di-fluoroacetic acid, a mixed halide acetic acid such as chloro-difluoro-acetic acid, a sulfur-containing analogue of acetic acid, thioacetic acid, or thioglycolic acid. In some implementations, the dry etchant includes a mixture of a carboxylic acid and a hydrogen halide in a vapor phase. For example, the dry etchant includes a mixture of acetic acid or formic acid with hydrogen chloride or hydrogen bromide. In some implementations, the organic vapor may be flowed with or without inert/carrier gas such as helium, neon, argon, xenon, and nitrogen.

In some implementations, at least partial removal of the residue includes reacting the organic vapor with the metal-containing resist material to form a volatile compound at a temperature less than about 200° C. In some implementations, at least partial removal includes substantial removal of the residue, where "substantial removal" refers to sufficient removal of the residue so that at least some of the one or more surfaces are exposed following removal.

In some implementations, the process chamber may be prepared with desired conditions for dry chamber cleaning prior to introducing the dry etchant. Preparation of the process chamber may achieve certain pressure conditions, levels of loose particles or film impurities, moisture levels, temperature conditions, or protection of surfaces or components (e.g., substrate support) in the process chamber from the dry etchant. In some implementations, preparing the process chamber may include purging and/or pumping the process chamber to remove unwanted particles. A purge gas may be flowed into the process chamber to facilitate removal of unwanted particles in the process chamber. A purge of metal organic precursor may be useful to avoid undesired byproducts and ensure sufficient removal of metal organic precursor before dry chamber cleaning.

In some implementations, chamber walls and other components may be heated to release unreacted precursor. The heat may additionally or alternatively facilitate removal of moisture in the process chamber. Without being limited by any theory, the presence of moisture can slow down the reaction between the dry etchant and the metal-containing resist material for removal of the metal-containing resist material. In addition, the increased temperature in the process chamber promotes a higher etch rate for removal of the metal-containing resist material. One or more heaters in the process chamber may heat the one or more surfaces to an elevated temperature. In some implementations, the elevated temperature may be between about 20° C. and about 180° C., between about 40° C. and about 160° C., or between about 80° C. and about 140° C.

In some implementations, preparing the process chamber may include providing a dummy substrate on a substrate support in the process chamber. Thus, the semiconductor substrate having the metal-containing resist material deposited thereon may be transferred out of the process chamber prior to dry chamber cleaning. That way, the semiconductor substrate is not exposed to the dry etchant when removing the residue of the metal-containing resist material from the one or more surfaces of the process chamber. The dummy substrate may be provided on the substrate support to protect the substrate support (e.g., electrostatic chuck) from exposure to the dry etchant during dry chamber cleaning. Alternatively, protection of the substrate support may occur by providing a protective cover over the substrate support during dry chamber cleaning.

The dry etchant may be introduced through a showerhead or separate chamber inlet coupled to the process chamber. The dry etchant may flow into the process chamber to react with the residue of the metal-containing resist material and form volatile products. Without being limited by any theory, an organo-metal-oxide resist material may have a tetrahedrally coordinated structure, and an organic vapor such as trifluoroacetic acid may protonate an oxygen lone pair to form a volatile byproduct. After volatile byproducts are formed, the process chamber may be pumped and purged to remove the volatile byproducts. Furthermore, the process chamber may be pumped and purged to remove residual dry etchant. Such residual dry etchant may cause undesired etching of subsequent semiconductor substrates.

The dry chamber clean may be optimized for low etch selectivity or high etch rate of resist material deposited in the process chamber. That way, unwanted resist material may be quickly and efficiently removed. In some implementations, higher temperatures and/or higher pressures may result in lower etch selectivity of the dry etchant and increase the etch rate. For instance, the resist material may be removed with an etch rate of up to 1 nm/s. During exposure to the dry etchant, the residue of the metal-containing resist material on the one or more surfaces may be subjected to an elevated temperature. The elevated temperature may be between about and about 180° C., between about 40° C. and about 160° C., or between about 80° C. and about 140° C. In some implementations, reacting the residue of the metal-containing resist material with the organic vapor forms a volatile compound at a temperature less than about 200° C. During exposure to the dry etchant, the pressure in the process chamber may be high. In some implementations, a chamber pressure is between about 0.01 Torr and 765 Ton, between about 0.1 Torr and 100 Torr, or between about 0.1 Ton and about 6 Ton. In some implementations, the chamber pressure is cycled between high and low pressures during exposure to the dry etchant. Organic vapor flow rate may also be tuned to control etch selectivity. In some implementations, an organic vapor flow rate is between about 0.05 SLM and about 10 SLM or between about 0.1 SLM and about 5 SLM.

As discussed above with respect to dry development, dry chamber clean is performed using an organic vapor such as an organic acid instead of vapors of halogens. Vapors of halogens such as vapors of hydrogen halides are prone to leave residual etch byproducts after removal of metal-containing resist material. However, an organic vapor such as trifluoroacetic acid form more volatile etch byproducts that are less difficult to remove from the process chamber. Organic vapors such as trifluoroacetic acid may be used in dry chamber cleaning in a plasma-free thermal process. In other words, the residue of the metal-containing resist material is removed without striking a plasma. Residual carbon, contaminants, or other remaining materials may or may not be removed by exposure to plasma. In some implementations, introduction of the dry etchant may be followed by exposing the one or more surfaces to an oxidizing gas such as oxygen ($O_2$), ozone ($O_3$), carbon dioxide ($CO_2$), or carbon monoxide (CO).

Due to the ability to clean as-deposited films (non-exposed or non-crosslinked) thermally, without the need for use of plasma, the approach described herein can also clean downstream and upstream components of the tool, beyond the process chamber (e.g., the exhaust lines going from the process chamber to the vacuum pump). More generally, this dry clean method can be used to clean other parts and components contaminated having a similar composition of a metal that has volatile byproducts with organic vapors.

In some implementations, interior surfaces of the process chamber may be compatible with the organic vapor of the present disclosure. Rather than having the interior surfaces of the process chamber resistant to plasma as well as resistant to vapors of halogens such as hydrogen halides, the interior surfaces may include any materials that are simply resistant to the organic vapor of the present disclosure. In some implementations, chamber walls of the process chamber may include aluminum oxide, anodized aluminum, or plastic.

In some implementations, the process chamber may include chamber parts temperature control coupled to the one or more surfaces (e.g., chamber walls) to control temperature. In some implementations, the process chamber may include gas inlets other than the showerhead for delivery of the dry etchant. The gas inlets may be positioned in regions of the process chamber with a higher concentration of the metal-containing resist material. The gas inlets may be positioned in regions of the process chamber where dry etchant is less likely to reach through delivery via a showerhead. In some implementations, the gas inlets may be positioned below the substrate support, positioned in the walls of the process chamber, and/or positioned close to an exhaust of the process chamber. Multiple gas inlets may be used for delivery of the dry etchant into the process chamber. This can ensure the dry clean of the entire process chamber. In various implementations, the dry etchant is delivered into the process chamber through one or more gas inlets separate from the showerhead, and deposition gases may be delivered into the process chamber through the showerhead. In some implementations, the showerhead may supply separate gases by keeping the gases largely segregated within the showerhead. The showerhead may include multiple plenum volumes. Multiple exhaust lines may be used to ensure separation of gases downstream from the process chamber. A switch may be operably coupled to the multiple exhaust lines so as to permit separation of dry etchant chemistry from deposition gases/precursors.

To protect the showerhead, a pressure differential may be used to prevent the dry etchant from entering the showerhead (e.g., backflow). In some implementations, the dry etchant may clean internal surfaces of the showerhead by flowing the dry etchant through the showerhead. However, residual organic vapors or moisture may be retained inside channels of the showerhead. In some implementations, the showerhead may be made out of a transparent material and heated with a suitable light source. For example, an irradiation source tuned to the appropriate wavelength (e.g., IR or blue wavelength) can directly heat the residual organic vapors and/or moisture to remove the residual organic vapors and/or moisture. Alternatively, the residual organic vapors and/or moisture may be removed by gas purging.

Figure 6B:
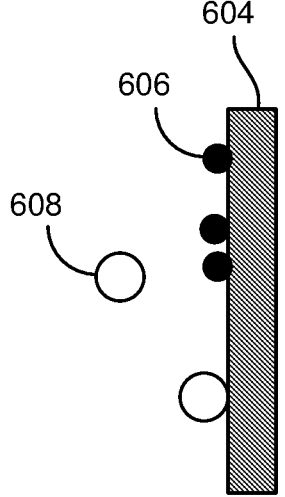

FIG. 6B shows a cross-sectional schematic illustration of the chamber walls 604 after a dry etchant removes the metal-containing EUV resist material 602 from the chamber walls 604. The dry etchant may include an organic vapor such as an organic acid, where the organic acid may include trifluoroacetic acid. The chamber walls 604 may be heated to an elevated temperature to promote low etch selectivity. The process chamber may be increased to a high pressure to promote low etch selectivity. Removal of the metal-containing EUV resist material 602 may occur without using plasma. Residual particles or clusters of metal oxide 606 may remain on the chamber walls 604 after exposure to the dry etchant. In addition, residual dry etchant 608 may remain in the process chamber.

Returning to FIG. 5, at block 506 of the process 500, the process chamber is optionally purged to remove residual dry etchant from the process chamber. The purge operation may involve flowing a purge gas into the process chamber or a combination of flowing a purge gas and pumping the process chamber to a desired chamber pressure. The purge gas may be an inert gas and/or a reactive gas. The reactive gas may react with residual dry etchant to facilitate ease of removal. The reactive gas may be, for example, a tin-based precursor such as an organotin precursor. The inert gas may be argon, helium, xenon, or nitrogen. The chamber pressure may be between about 0.1 Torr and about 6 Torr.

In some implementations, the purge operation may proceed at a high temperature. The high temperature may facilitate removal of organic vapors from the process chamber. In one example, one or more heaters coupled to the one or more surfaces of the process chamber may heat the process chamber to the high temperature. In another example, one or more IR sources or LEDs may be installed in the process chamber to heat the process chamber to the high temperature. The high temperature may be between about 20° C. and about 180° C. or between about 80° C. and about 140° C.

In some implementations, a direct or remote plasma-based treatment is useful to accelerate the removal of residual dry etchant, where the residual dry etchant may cover internal surfaces of the process chamber following dry chamber clean. In other implementations, a non-plasma treatment may be useful to accelerate the removal of residual dry etchant. Oxidizing gas may be introduced to oxidize residual dry etchant. Thus, the non-plasma treatment may include delivering a flow of ozone and/or oxygen gas.

Figure 6C:
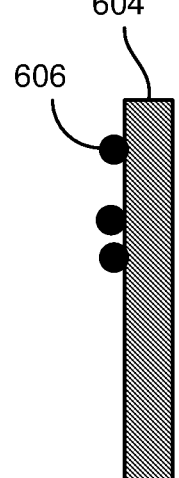

FIG. 6C shows a cross-sectional schematic illustration of the chamber walls 604 after removal of residual dry etchant 608 from the process chamber. Pumping/purging operations may be performed to exhaust the residual dry etchant 608 from the process chamber. In some implementations, the chamber walls 604 or other components of the process chamber may be heated to promote release of the residual dry etchant 608. In some implementations, direct or remote plasma-based treatments may be applied to remove the residual dry etchant 608, where such plasma-based treatments may include a fluorine-based plasma process, oxygen-based plasma process, or combinations thereof. In some other implementations, a non-plasma treatment may be applied to remove the residual dry etchant 608. Particles or clusters of metal oxide 606 may remain on the chamber walls 604.

Returning to FIG. 5, at block 508 of the process 500, the one or more surfaces of the process chamber are optionally conditioned by forming a protective coating of the metal-containing resist material on the one or more surfaces of the process chamber. An average thickness of the protective coating may be less than an average thickness of the residue of the metal-containing resist material. In some implementations, the average thickness of the protective coating is equal to or greater than about 1 nm, equal to or greater than about 2 nm, equal to or greater than about 3 nm, or between about 1 nm and about 5 nm. Alternatively, the one or more surfaces are optionally conditioned by forming a protective coating made of different materials than the metal-containing resist material. Such a protective coating may be a variation of organotin oxide. After exposure to the dry etchant, the one or more surfaces are left exposed. Exposed surfaces in the process chamber may be vulnerable to attack especially by halogen-based species. The conditioning operation may provide protection of the one or more surfaces. Additionally, the conditioning operation may cover residual particles or clusters of metal oxide stuck on the one or more surfaces. That way, the particles or clusters of metal oxide are less likely to contaminate wafers during subsequent processing.

Conditioning the one or more surfaces of the process chamber may occur by a vapor-based deposition technique such as a CVD or ALD technique. Organometallic materials are produced in the vapor phase and deposited on the one or more surfaces of the process chamber. The organometallic materials may be, for example, deposited based on a gas phase reaction of an organotin precursor such as isopropyl (tris)(dimethylamino)tin and water vapor. The flow of water vapor may be relatively low. During conditioning, the substrate support may be protected or covered by a dummy wafer or other protective covering. The protective coating may be formed on chamber walls, floors, ceilings, or chamber components such as gas inlets, showerheads, and exhaust lines. After deposition of the protective coating of the metal-containing resist material, pumping/purging operations may follow to remove excess precursor and/or counter-reactant. Conditioning the one or more surfaces of the process chamber can trap residual particles of metal oxide and limit particle contamination.

Figure 6D:
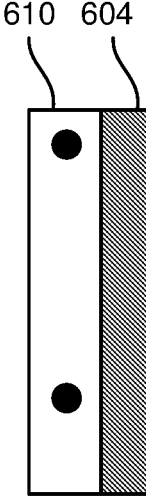

FIG. 6D shows a cross-sectional schematic illustration of a metal-containing resist material 610 formed on the chamber walls 604 of the process chamber. The metal-containing EUV resist material 610 may be re-deposited in a conditioning operation to protect the chamber walls 604 and trap the particles or clusters of metal oxide 606 from contaminating wafers during processing. This may also be referred to as chamber seasoning. The metal-containing EUV resist material 610 is formed by a vapor deposition method such as CVD or ALD. In some implementations, the metal-containing EUV resist material 610 may be an organotin oxide. By conditioning/seasoning the chamber walls 604 and other internal surfaces of the process chamber, undesirable first wafer effects are mitigated when re-initiating deposition operations on semiconductor substrates.

While this disclosure frequently refers to the removal of EUV-sensitive films that have been exposed and/or developed, the removal processes described can be extended to EUV films of similar composition (e.g., other $MO_xR_y$-based films), for example, other films containing a metal oxide, in which the metal can form volatile byproducts with organic vapors, including unexposed EUV resist films. In some implementations, films other than EUV resists can be removed by this method, for example hard masks, UV resists or films of similar composition having other applications; in this respect, the described removal process relates to the film's chemical composition, as opposed to its function.

Apparatus

An apparatus of the present disclosure is configured for dry removal of EUV resist. The apparatus may be configured to perform dry development or dry chamber clean. The apparatus may be configured for other processing operations such as deposition, bevel and backside cleaning, post-application baking, EUV scanning, post-exposure baking, photoresist reworking, descum, smoothing, curing, and other operations. In some implementations, the apparatus is configured to perform all dry operations. In some implementations, the apparatus is configured to perform a combination of wet and dry operations. The apparatus may include a single wafer chamber or multiple stations in the same process chamber. With multiple stations in the same process chamber, various processing operations such as those described in the present disclosure may be performed in different stations in the same process chamber. In one example, PEB thermal treatment may be performed in one station and development in another station.

The apparatus configured for dry removal of EUV resist includes a process chamber with a substrate support. The apparatus may include a dry etch line coupled to the process chamber for delivery of etch gas. In some implementations, the etch gas includes an organic vapor such as trifluoroacetic acid. The apparatus may include one or more heaters for temperature control. Such heaters may be provided in the process chamber and/or in the substrate support. In some implementations, there may be multiple gas inlets positioned within the process chamber to flow etch gas near regions where unintended EUV resist tend to form. The apparatus may further include one or more sensors for sensing particle count, wafer count, thickness count, or other parameters for triggering the dry chamber clean and/or endpoint of the dry chamber clean.

In some implementations, the process chamber is made of an inexpensive material such as plastic. In some other implementations, the process chamber is made of a metal such as anodized aluminum or a ceramic such as aluminum oxide.

Figure 7:
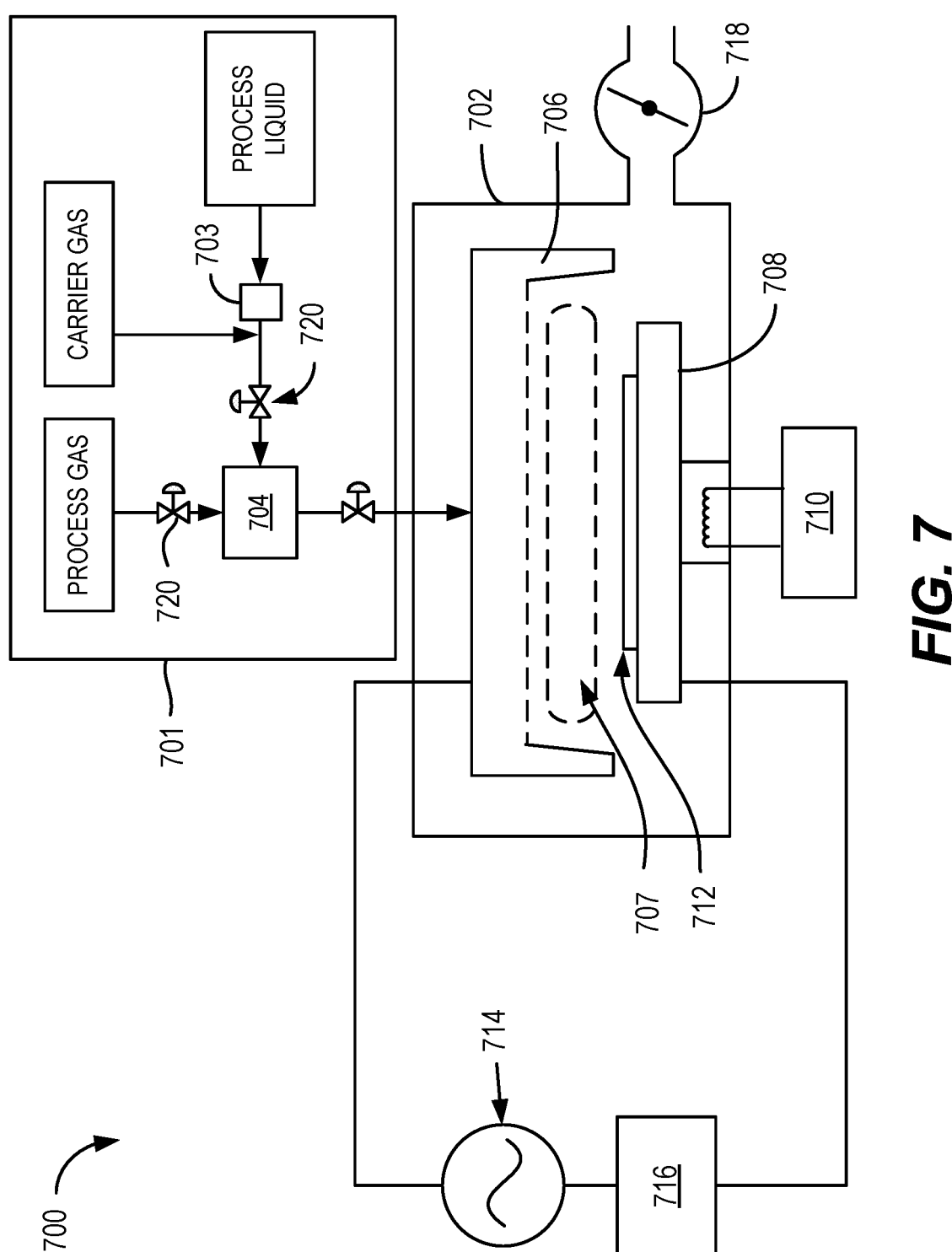
FIG. 7 depicts a schematic illustration of an example process station that is suitable for performing dry development, clean, rework, descum, and smoothing operations according to some implementations.
Figure 8:
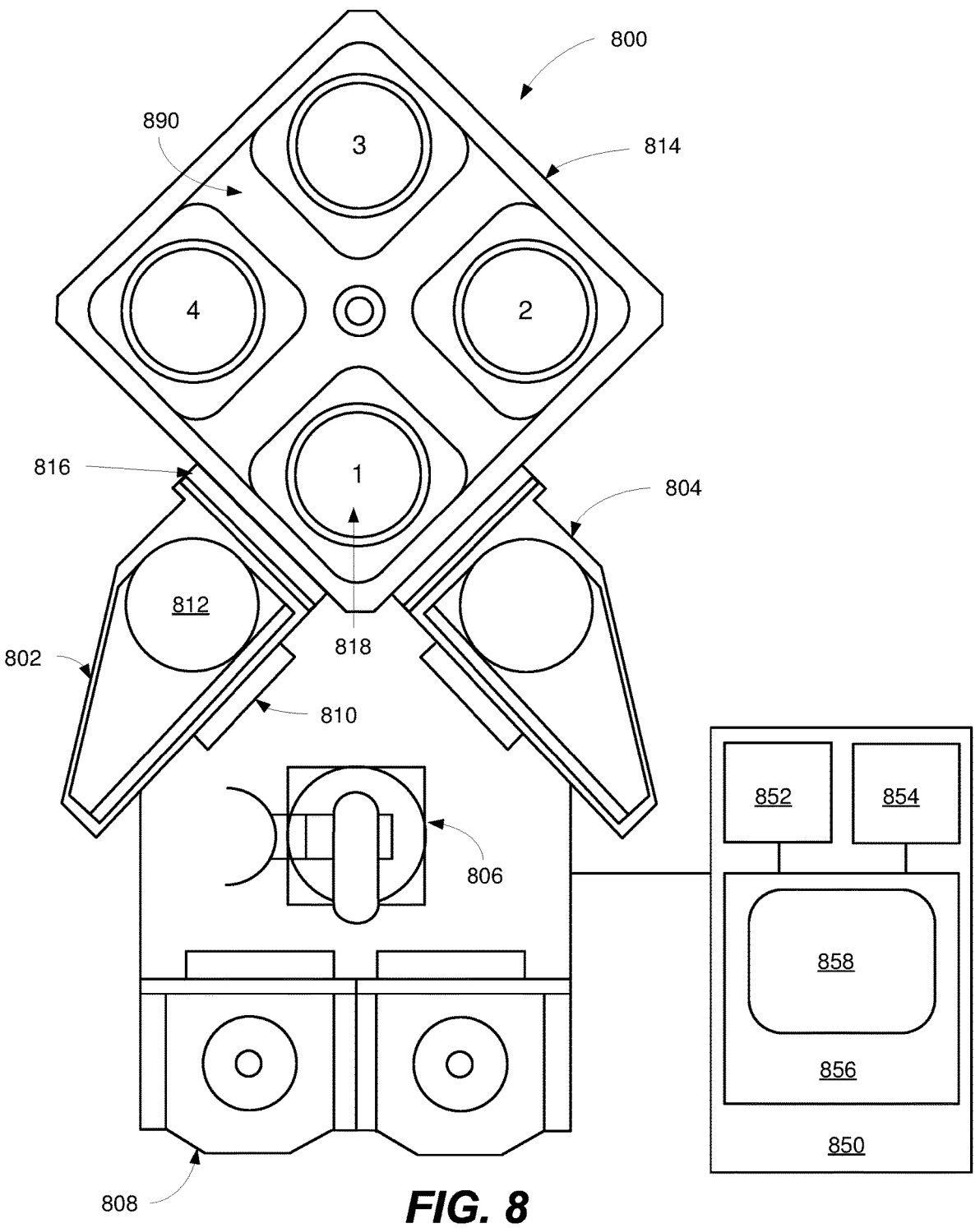
FIG. 8 depicts a schematic illustration of an example multi-station processing tool suitable for implementation of various dry development, clean, rework, descum, and smoothing operations described herein.

FIG. 7 depicts a schematic illustration of an example process station that is suitable for performing dry development, clean, rework, descum, and smoothing operations according to some implementations. A plurality of process stations 700 may be included in a common low-pressure process tool environment. For example, FIG. 8 depicts an implementation of a multi-station processing tool 800, such as a VECTOR® processing tool available from Lam Research Corporation, Fremont, CA. In some implementations, one or more hardware parameters of the process tool 800 including those discussed in detail below may be adjusted programmatically by one or more computer controllers 850.

A process station may be configured as a module in a cluster tool. FIG. 10 depicts a semiconductor process cluster tool architecture with vacuum-integrated deposition and patterning modules suitable for implementation of the implementations described herein. Such a cluster process tool architecture can include resist deposition, resist exposure (EUV scanner), resist development and etch modules, as described above and further below with reference to FIGS. 9 and 10.

In some implementations, certain of the processing functions can be performed consecutively in the same module, for example dry development and etch or dry deposition and dry chamber clean. And implementations of this disclosure are directed to methods and apparatus for receiving a wafer, including an EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 7, process station 700 fluidly communicates with reactant delivery system 701 for delivering process gases to a distribution showerhead 706. Reactant delivery system 701 optionally includes a mixing vessel 704 for blending and/or conditioning process gases, for delivery to showerhead 706. One or more mixing vessel inlet valves 720 may control introduction of process gases to mixing vessel 704. Where plasma exposure is used, plasma may also be delivered to the showerhead 706 or may be generated in the process station 700. As noted above, in at least some implementations, non-plasma thermal exposure is favored.

FIG. 7 includes an optional vaporization point 703 for vaporizing liquid reactant to be supplied to the mixing vessel 704. In some implementations, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 706 distributes process gases toward substrate 712. In the implementation shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some implementations, pedestal 708 may be raised or lowered to expose substrate 712 to a volume 707 between the substrate 712 and the showerhead 706. It will be appreciated that, in some implementations, pedestal height may be adjusted programmatically by a suitable computer controller 750. In some implementations, the showerhead 706 may have multiple plenum volumes with multiple temperature controls.

In some implementations, pedestal 708 may be temperature controlled via heater 710. In some implementations, the pedestal 708 may be heated to a temperature of greater than 0° C. and up to 300° C. or more, for example 40° C. to 160° C., such as about 80° C. to 140° C., during non-plasma thermal exposure of a photopatterned resist to organic vapor development chemistry, such as trifluoroacetic acid, as described in disclosed implementations. In some implementations, the heater 710 of the pedestal 708 may include a plurality of independently controllable temperature control zones.

Further, in some implementations, pressure control for process station 700 may be provided by a butterfly valve 718. As shown in the implementation of FIG. 7, butterfly valve 718 throttles a vacuum provided by a downstream vacuum pump (not shown). However, in some implementations, pressure control of process station 700 may also be adjusted by varying a flow rate of one or more gases introduced to the process station 700.

In some implementations, a position of showerhead 706 may be adjusted relative to pedestal 708 to vary a volume 707 between the substrate 712 and the showerhead 706. Further, it will be appreciated that a vertical position of pedestal 708 and/or showerhead 706 may be varied by any suitable mechanism within the scope of the present disclosure. In some implementations, pedestal 708 may include a rotational axis for rotating an orientation of substrate 712. It will be appreciated that, in some implementations, one or more of these example adjustments may be performed programmatically by one or more suitable computer controllers.

Where plasma may be used, for example in descumming or smoothing operations, showerhead 706 and pedestal 708 electrically communicate with a radio frequency (RF) power supply 714 and matching network 716 for powering a plasma. In some implementations, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are up to about 500 W.

In some implementations, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some implementations, instructions for setting one or more reactor parameters may be included in a recipe phase. For example, a recipe phase may include instructions for setting a flow rate of a dry development chemistry reactant gas, such as trifluoroacetic acid, and time delay instructions for the recipe phase. In some implementations, the controller 750 may include any of the features described below with respect to system controller 850 of FIG. 8.

As described above, one or more process stations may be included in a multi-station processing tool. FIG. 8 shows a schematic view of an implementation of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment to treat the substrate surface in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the implementation depicted in FIG. 8 includes load locks, it will be appreciated that, in some implementations, direct entry of a wafer into a process station may be provided.

The depicted processing chamber 814 includes four process stations, numbered from 1 to 4 in the implementation shown in FIG. 8. Each station has a heated pedestal (shown at 818 for station 1), and gas line inlets. It will be appreciated that in some implementations, each process station may have different or multiple purposes. For example, in some implementations, a process station may be switchable between dry development and etch process modes. Additionally or alternatively, in some implementations, processing chamber 814 may include one or more matched pairs of dry development and etch process stations. While the depicted processing chamber 814 includes four stations, it will be understood that a processing chamber according to the present disclosure may have any suitable number of stations. For example, in some implementations, a processing chamber may have five or more stations, while in other implementations a processing chamber may have three or fewer stations.

FIG. 8 depicts an implementation of a wafer handling system 890 for transferring wafers within processing chamber 814. In some implementations, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an implementation of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some implementations, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some implementations, system control software 858 may include input/output control (IOC) sequencing instructions for controlling the various parameters described above. Other computer software and/or programs stored on mass storage device 854 and/or memory device 856 associated with system controller 850 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling organic vapor composition (e.g., trifluoroacetic acid as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the implementations herein.

A pressure control program may include code for maintaining the pressure in the reaction chamber in accordance with the implementations herein.

In some implementations, there may be a user interface associated with system controller 850. The user interface may include a display screen, graphical software displays of the apparatus and/or process conditions, and user input devices such as pointing devices, keyboards, touch screens, microphones, etc.

In some implementations, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate development, clean, and/or etch processes according to various implementations described herein.

The system controller 850 will typically include one or more memory devices and one or more processors configured to execute the instructions so that the apparatus will perform a method in accordance with disclosed implementations. Machine-readable media containing instructions for controlling process operations in accordance with disclosed implementations may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a development chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

ICP reactors which, in certain implementations, may be suitable for etch operations suitable for implementation of some implementations, are now described. Although ICP reactors are described herein, in some implementations, it should be understood that capacitively coupled plasma reactors may also be used.

Figure 9:
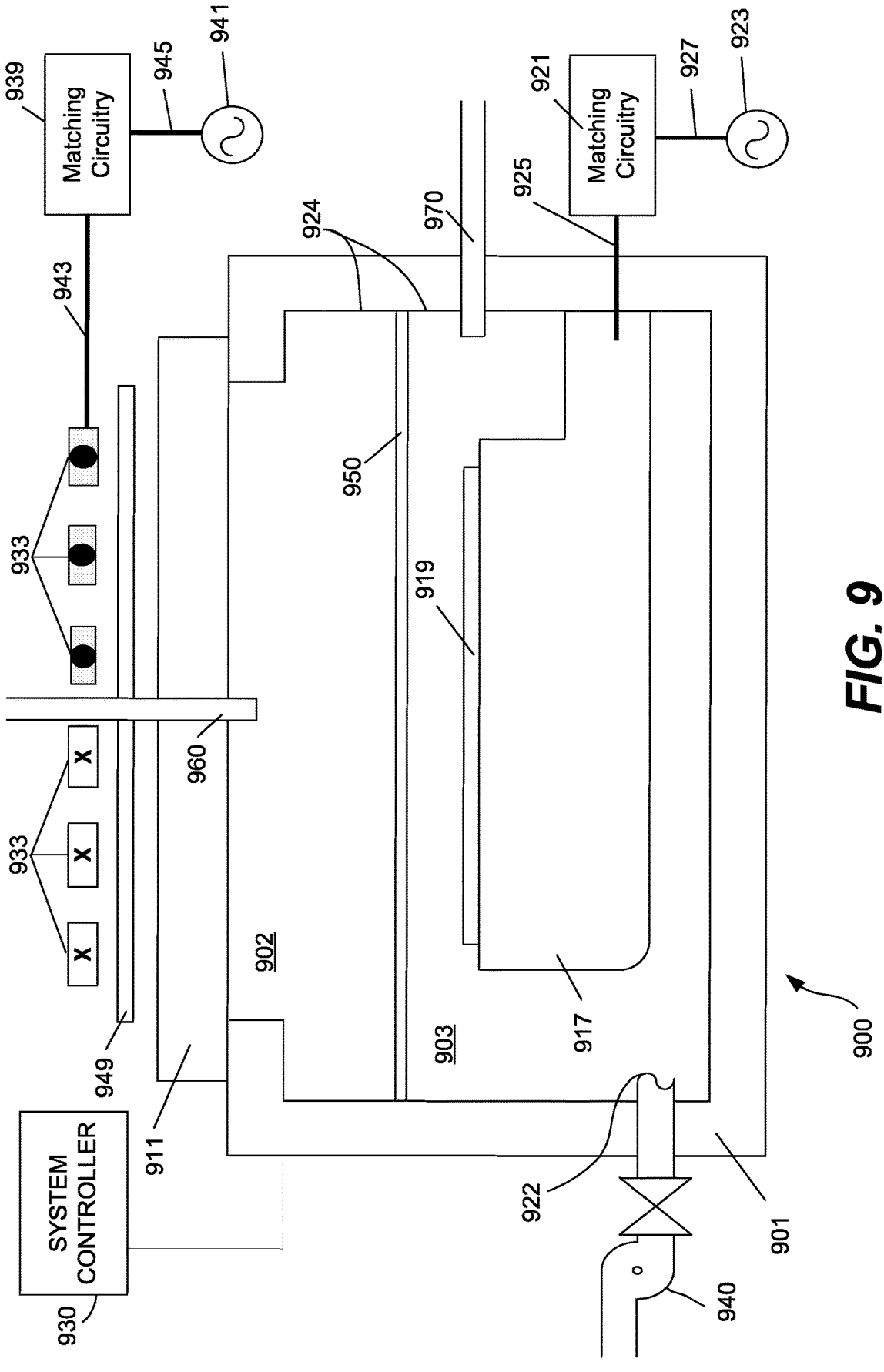
FIG. 9 shows a cross-sectional schematic view of an example inductively-coupled plasma apparatus for implementing certain implementations and operations described herein.
Figure 10:
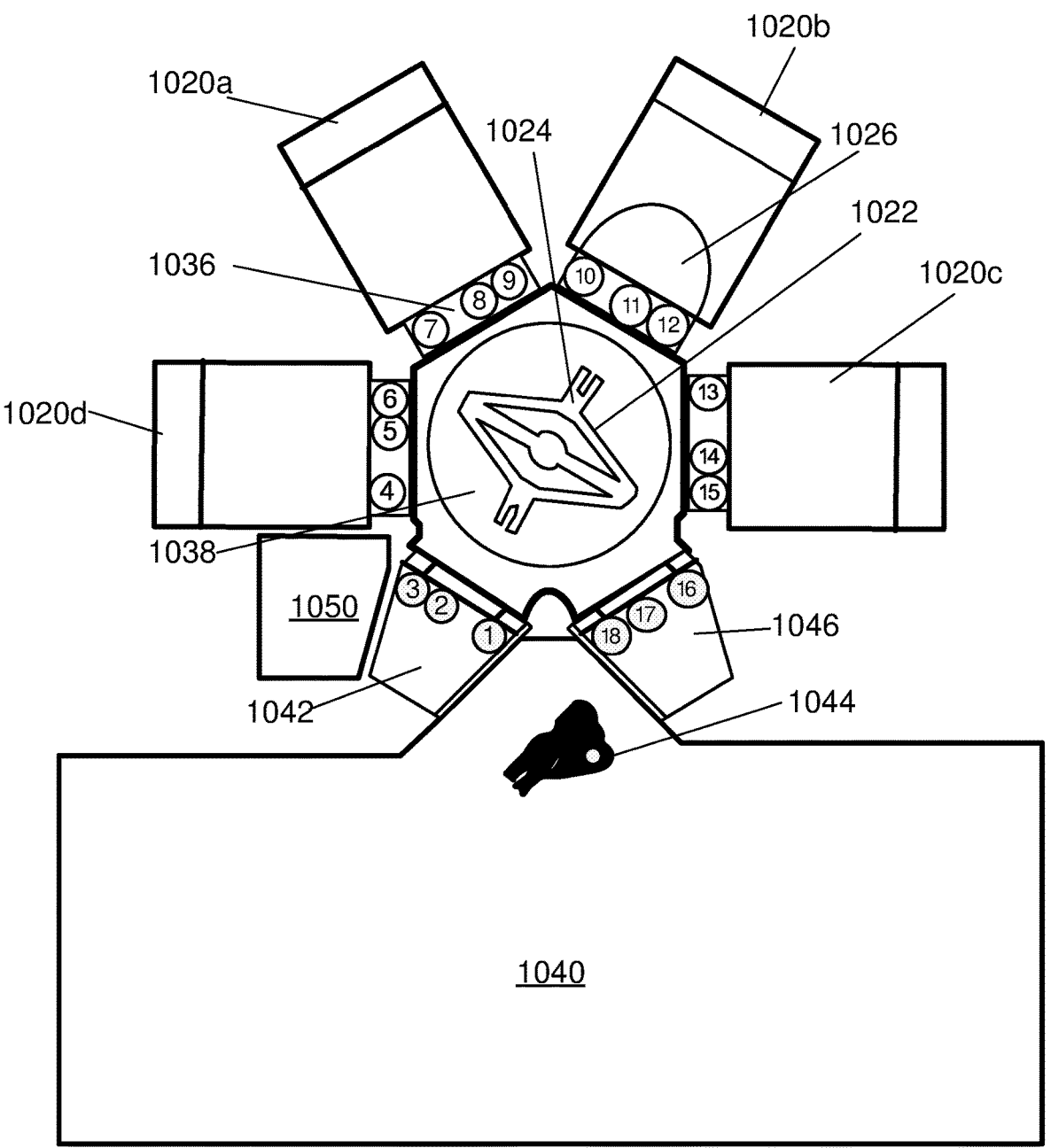
FIG. 10 depicts a semiconductor process cluster tool architecture with vacuum-integrated deposition and patterning modules that interface with a vacuum transfer module, suitable for implementations of processes described herein.

FIG. 9 schematically shows a cross-sectional view of an inductively coupled plasma apparatus 900 appropriate for implementing certain implementations or aspects of implementations such as dry development, clean, and/or etch, an example of which is a Kiyo® reactor, produced by Lam Research Corp. of Fremont, CA. In other implementations, other tools or tool types having the functionality to conduct the dry development, clean, and/or etch processes described herein may be used for implementation.

The inductively coupled plasma apparatus 900 includes an overall process chamber 924 structurally defined by chamber walls 901 and a window 911. The chamber walls 901 may be fabricated from stainless steel, aluminum, or plastic. The window 911 may be fabricated from quartz or other dielectric material. An optional internal plasma grid 950 divides the overall process chamber into an upper sub-chamber 902 and a lower sub chamber 903. In most implementations, plasma grid 950 may be removed, thereby utilizing a chamber space made of sub chambers 902 and 903. A chuck 917 is positioned within the lower sub-chamber 903 near the bottom inner surface. The chuck 917 is configured to receive and hold a semiconductor wafer 919 upon which the etching and deposition processes are performed. The chuck 917 can be an electrostatic chuck for supporting the wafer 919 when present. In some implementations, an edge ring (not shown) surrounds chuck 917, and has an upper surface that is approximately planar with a top surface of the wafer 919, when present over chuck 917. The chuck 917 also includes electrostatic electrodes for chucking and dechucking the wafer 919. A filter and DC clamp power supply (not shown) may be provided for this purpose. Other control systems for lifting the wafer 919 off the chuck 917 can also be provided. The chuck 917 can be electrically charged using an RF power supply 923. The RF power supply 923 is connected to matching circuitry 921 through a connection 927. The matching circuitry 921 is connected to the chuck 917 through a connection 925. In this manner, the RF power supply 923 is connected to the chuck 917. In various implementations, a bias power of the electrostatic chuck may be set at about 50 V or may be set at a different bias power depending on the process performed in accordance with disclosed implementations. For example, the bias power may be between about 20 V and about 100 V, or between about 30 V and about 150 V.

Elements for plasma generation include a coil 933 is positioned above window 911. In some implementations, a coil is not used in disclosed implementations. The coil 933 is fabricated from an electrically conductive material and includes at least one complete turn. The example of a coil 933 shown in FIG. 9 includes three turns. The cross sections of coil 933 are shown with symbols, and coils having an "X" extend rotationally into the page, while coils having a "●" extend rotationally out of the page. Elements for plasma generation also include an RF power supply 941 configured to supply RF power to the coil 933. In general, the RF power supply 941 is connected to matching circuitry 939 through a connection 945. The matching circuitry 939 is connected to the coil 933 through a connection 943. In this manner, the RF power supply 941 is connected to the coil 933. An optional Faraday shield 949 is positioned between the coil 933 and the window 911. The Faraday shield 949 may be maintained in a spaced apart relationship relative to the coil 933. In some implementations, the Faraday shield 949 is disposed immediately above the window 911. In some implementations, the Faraday shield 949 is between the window 911 and the chuck 917. In some implementations, the Faraday shield 949 is not maintained in a spaced apart relationship relative to the coil 933. For example, the Faraday shield 949 may be directly below the window 911 without a gap. The coil 933, the Faraday shield 949, and the window 911 are each configured to be substantially parallel to one another. The Faraday shield 949 may prevent metal or other species from depositing on the window 911 of the process chamber 924.

Process gases may be flowed into the process chamber through one or more main gas flow inlets 960 positioned in the upper sub-chamber 902 and/or through one or more side gas flow inlets 970. Likewise, though not explicitly shown, similar gas flow inlets may be used to supply process gases to a capacitively coupled plasma processing chamber. A vacuum pump, e.g., a one or two stage mechanical dry pump and/or turbomolecular pump 940, may be used to draw process gases out of the process chamber 924 and to maintain a pressure within the process chamber 924. For example, the vacuum pump may be used to evacuate the lower sub-chamber 903 during a purge operation. A valve-controlled conduit may be used to fluidically connect the vacuum pump to the process chamber 924 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 900, one or more process gases may be supplied through the gas flow inlets 960 and/or 970. In certain implementations, process gas may be supplied only through the main gas flow inlet 960, or only through the side gas flow inlet 970. In some cases, the gas flow inlets shown in the figure may be replaced by more complex gas flow inlets, one or more showerheads, for example. The Faraday shield 949 and/or optional grid 950 may include internal channels and holes that allow delivery of process gases to the process chamber 924. Either or both of Faraday shield 949 and optional grid 950 may serve as a showerhead for delivery of process gases. In some implementations, a liquid vaporization and delivery system may be situated upstream of the process chamber 924, such that once a liquid reactant or precursor is vaporized, the vaporized reactant or precursor is introduced into the process chamber 924 via a gas flow inlet 960 and/or 970.

Radio frequency power is supplied from the RF power supply 941 to the coil 933 to cause an RF current to flow through the coil 933. The RF current flowing through the coil 933 generates an electromagnetic field about the coil 933. The electromagnetic field generates an inductive current within the upper sub-chamber 902. The physical and chemical interactions of various generated ions and radicals with the wafer 919 etch features of and selectively deposit layers on the wafer 919.

If the plasma grid 950 is used such that there is both an upper sub-chamber 902 and a lower sub-chamber 903, the inductive current acts on the gas present in the upper sub-chamber 902 to generate an electron-ion plasma in the upper sub-chamber 902. The optional internal plasma grid 950 limits the amount of hot electrons in the lower sub-chamber 903. In some implementations, the apparatus 900 is designed and operated such that the plasma present in the lower sub-chamber 903 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 903 through port 922. The chuck 917 disclosed herein may operate at elevated temperatures ranging between about 10° C. and about 250° C. The temperature will depend on the process operation and specific recipe.

Apparatus 900 may be coupled to facilities (not shown) when installed in a clean room or a fabrication facility. Facilities include plumbing that provide processing gases, vacuum, temperature control, and environmental particle control. These facilities are coupled to apparatus 900, when installed in the target fabrication facility. Additionally, apparatus 900 may be coupled to a transfer chamber that allows robotics to transfer semiconductor wafers into and out of apparatus 900 using typical automation.

In some implementations, a system controller 930 (which may include one or more physical or logical controllers) controls some or all of the operations of a process chamber 924. The system controller 930 may include one or more memory devices and one or more processors. In some implementations, the apparatus 900 includes a switching system for controlling flow rates and durations when disclosed implementations are performed. In some implementations, the apparatus 900 may have a switching time of up to about 500 ms, or up to about 750 ms. Switching time may depend on the flow chemistry, recipe chosen, reactor architecture, and other factors.

In some implementations, the system controller 930 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 930, which may control various components or subparts of the system or systems. The system controller 930, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 930, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 930 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 930 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWIN-SCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 10 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 10 depicts a semiconductor process cluster tool architecture with vacuum-integrated deposition and patterning modules that interface with a vacuum transfer module, suitable for implementations of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 1038 interfaces with four processing modules 1020a-1020d, which may be individually optimized to perform various fabrication processes. By way of example, processing modules 1020a-1020d may be implemented to perform deposition, evaporation, ELD, dry development, clean, etch, strip, and/or other semiconductor processes. For example, module 1020a may be an ALD reactor that may be operated to perform in a non-plasma, thermal atomic layer depositions as described herein, such as Vector tool, available from Lam Research Corporation, Fremont, CA. And module 1020b may be a PECVD tool, such as the Lam Vector®. It should be understood that the figure is not necessarily drawn to scale.

Airlocks 1042 and 1046, also known as a loadlocks or transfer modules, interface with the VTM 1038 and a patterning module 1040. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible implementation of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to Figure but without the integrated patterning module.

Airlock 1042 may be an "outgoing" loadlock, referring to the transfer of a substrate out from the VTM 1038 serving a deposition module 1020a to the patterning module 1040, and airlock 1046 may be an "ingoing" loadlock, referring to the transfer of a substrate from the patterning module 1040 back in to the VTM 1038. The ingoing loadlock 1046 may also provide an interface to the exterior of the tool for access and egress of substrates. Each process module has a facet that interfaces the module to VTM 1038. For example, deposition process module 1020a has facet 1036. Inside each facet, sensors, for example, sensors 1-18 as shown, are used to detect the passing of wafer 1026 when moved between respective stations. Patterning module 1040 and airlocks 1042 and 1046 may be similarly equipped with additional facets and sensors, not shown.

Main VTM robot 1022 transfers wafer 1026 between modules, including airlocks 1042 and 1046. In one implementation, robot 1022 has one arm, and in another implementation, robot 1022 has two arms, where each arm has an end effector 1024 to pick wafers such as wafer 1026 for transport. Front-end robot 1044, in is used to transfer wafers 1026 from outgoing airlock 1042 into the patterning module 1040, from the patterning module 1040 into ingoing airlock 1046. Front-end robot 1044 may also transport wafers 1026 between the ingoing loadlock and the exterior of the tool for access and egress of substrates. Because ingoing airlock module 1046 has the ability to match the environment between atmospheric and vacuum, the wafer 1026 is able to move between the two pressure environments without being damaged.

It should be noted that an EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 1042 may provide this function by holding the transferred wafers at a lower pressure, no higher than the pressure in the patterning module 1040, for a period of time and exhausting any off-gassing, so that the optics of the patterning module 1040 are not contaminated by off-gassing from the substrate. A suitable pressure for the outgoing, off-gassing airlock is no more than 1E-8 Torr.

In some implementations, a system controller 1050 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 1050 may include one or more memory devices and one or more processors. The processor may include a central processing unit (CPU) or computer, analog and/or digital input/ output connections, stepper motor controller boards, and other like components. Instructions for implementing appropriate control operations are executed on the processor. These instructions may be stored on the memory devices associated with the controller or they may be provided over a network. In certain implementations, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some implementations, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various implementations, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, developing the photopatterned resist, and etching the underlying layer or layer stack using the patterned resist as a mask. Development may be performed using an organic vapor such as an organic acid.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 7, 8, or 9 may be implemented with the tool in FIG. 10.

Figure 11A:
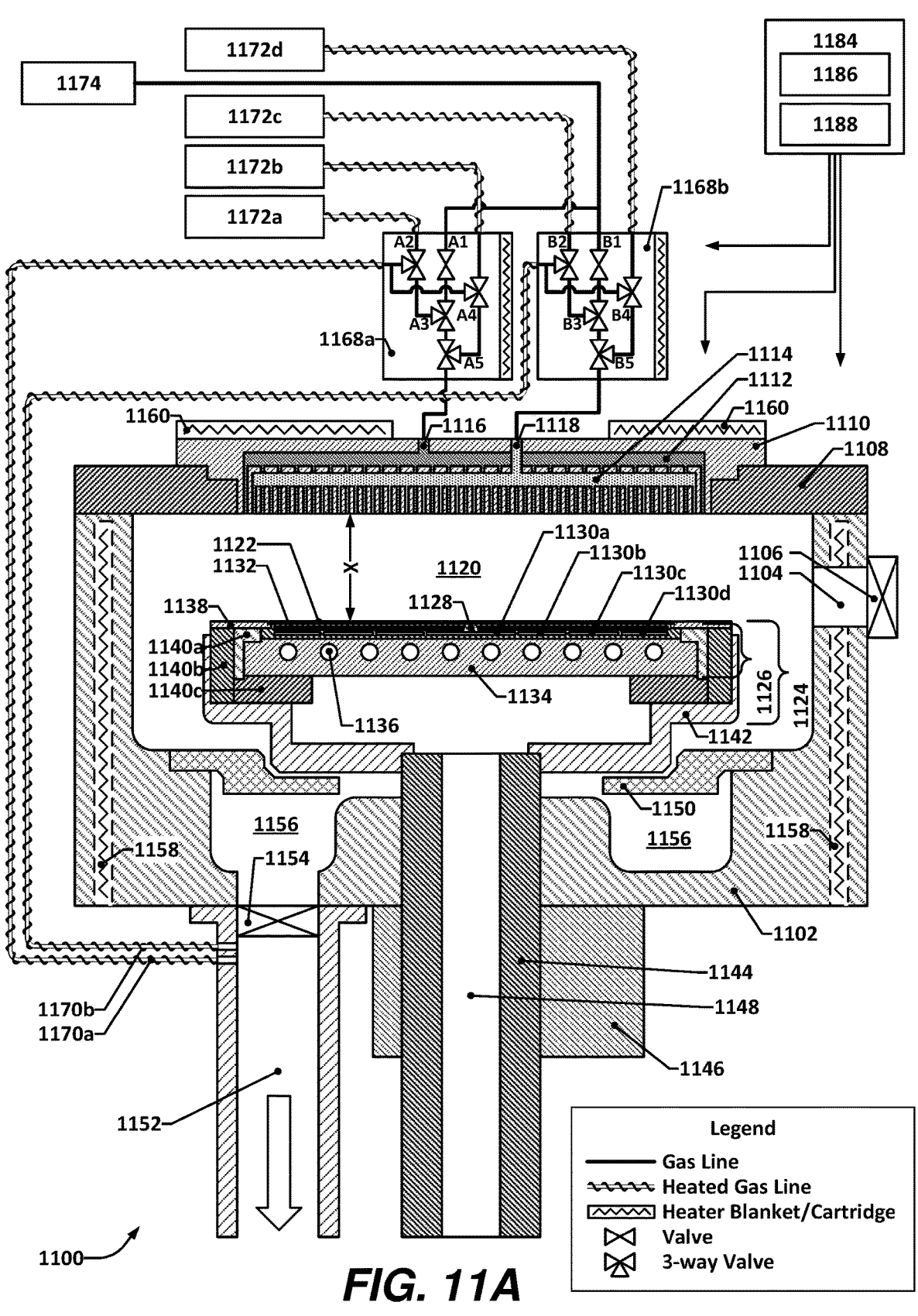
FIG. 11A depicts a cross-sectional schematic view of an example of a dry deposition apparatus according to some implementations.

FIG. 11A shows an example of a deposition chamber for vapor-based deposition of metal-containing resist material according to some implementations. As can be seen, an apparatus 1100 is depicted that has a process chamber 1102 that includes a lid 1108. The process chamber 1102 may include a wafer transfer passage 1104 through one of the walls of the process chamber 1102 that is sized to allow a substrate 1122 to be passed therethrough and into the interior of the process chamber 1102, where the substrate 1122 may be placed on a wafer support 1124. The wafer transfer passage 1104 may have a gate valve 1106 or similar door mechanism that may be operated to seal or unseal the wafer transfer passage 1104, thereby allowing the environment within the process chamber 1102 to be isolated from the environment on the other side of the gate valve 1106. For example, the process chamber 1102 may be provided substrates 1122 via a wafer handling robot that is located in an adjoining transfer chamber. Such a transfer chamber may, for example, have multiple process chambers 1102 arranged around its periphery, with each such process chamber 1102 connected with the transfer chamber via a corresponding gate valve 1106.

The wafer support 1124 may, for example, include an electrostatic chuck (ESC) 1126, which may be used to provide a wafer support surface for supporting the substrate 1122. The ESC 1126 may include, for example, a base plate 1134 that is bonded to a top plate 1128 that is placed atop the base plate 1134. The top plate 1128 may, for example, be made of a ceramic material and may have embedded within it several other components. In the depicted example, the top plate 1128 has two separate electrical systems embedded within it. One such system is an electrostatic clamping electrode system, which may have one or more clamping electrodes 1132 that may be used to generate an electric charge within the substrate 1122 that causes the substrate 1122 to be drawn against the wafer support surface of the top plate 1128. In the implementation of FIG. 11A, there are two clamping electrodes 1132 that provide a bi-polar electrostatic clamping system, although some implementations may use only a single clamping electrode 1132 to provide a mono-polar electrostatic clamping system.

The other system is a thermal control system that may be used to control the temperature of the substrate 1122 during processing conditions. In FIG. 11A, the thermal control system is a multi-zone thermal control system featuring four annular resistance heater traces 1130*a,* 1130*b,* 1130*c,* and 1130*d* that are concentric with one another and positioned beneath the clamping electrodes 1132. The center resistance heater traces 1130*a* may, in some implementations, fill a generally circular area, and each resistance heater trace 1130*a/b/c/d* may follow a generally serpentine or otherwise meandering path within a corresponding annular region. Each resistance heater trace 1130*a/b/c/d* may be individually controlled to provide a variety of radial heating profiles in the top plate 1128; such a four-zone heating system may, for example, be controlled to maintain the substrate 1122 so as to have a temperature uniformity of ±0.5° C. in some cases. While the apparatus 1100 of FIG. 11A features a four-zone heating system in the ESC 1126, other implementations may use single-zone or multi-zone heating systems having more or fewer than four zones.

In some implementations, of, for example, temperature control mechanisms discussed above, heat pumps may be used instead of resistance heating traces. For example, in some implementations, the resistance heater traces may be replaced by, or augmented by, Peltier junctions or other, similar devices that may be controlled to "pump" heat from one side thereof to another. Such mechanisms may be used, for example, to draw heat from the top plate 1128 (and thus the substrate 1122) and direct it into the base plate 1134 and the heat exchange passages 1136, thereby allowing the substrate 1122 to be cooled more rapidly and more effectively, if desired.

The ESC 1126 may also include, for example, a base plate 1134 that may be used to provide structural support to the underside of the top plate 1128 and which may also act as a heat dispersion system. For example, the base plate 1134 may include one or more heat exchange passages 1136 that are arranged in a generally distributed fashion throughout the base plate 1134, e.g., the heat exchange passages 1136 may follow a serpentine, circular switchback, or spiral pattern around the center of the base plate 1134. A heat exchange medium, e.g., water or inert fluorinated liquid, may be circulated through the heat exchange passages 1136 during use. The flow rate and temperature of the heat exchange medium may be externally controlled so as to result in a particular heating or cooling behavior in the base plate 1134.

The ESC 1126 may, for example, be supported by a wafer support housing 1142 that is connected with, and supported by, a wafer support column 1144. The wafer support column 1144 may, for example, have a routing passage 1148 other pass-throughs for routing cabling, fluid flow conduits, and other equipment to the underside of the base plate 1134 and/or the top plate 1128. For example, while not shown in FIG. 11A, cabling for providing electrical power to the resistance heater traces 1130a/b/c/d may be routed through the routing passage 1148, as may cabling for providing electrical power to the clamping electrodes 1132. Other cables, e.g., cables for temperature sensors, may also be routed through the routing passage 1148 to locations in the interior of the wafer support 1124. In implementations with a temperature-controllable base plate 1134, conduits for conveying heat exchange medium to and from the base plate 1134 may also be routed through the routing passage 1148. To avoid undue clutter, such cables and conduits are not depicted in FIG. 11A, but it is to be understood that they would, nonetheless, be present.

The apparatus 1100 of FIG. 11A also includes a wafer support z-actuator 1146 that may provide movable support to the wafer support column 1144. The wafer support z-actuator 1146 may be actuated to cause the wafer support column 1144, and the wafer support 1124 supported thereby, to move up or down vertically, e.g., by up to several inches, within a reaction space 1120 of the process chamber 1102. In doing so, a gap distance X between the substrate 1122 and the underside of the showerhead 1110 may be tuned depending on various process conditions.

The wafer support 1124 may also include, in some implementations, one or more edge rings that may be used to control and/or fine-tune various process conditions. In FIG. 11A, an upper edge ring 1138 is provided that lies on top of, for example, lower edge rings 1140a and 1140b, which, in turn, are supported by the wafer support housing 1142 and a third lower edge ring 1140c. The upper edge ring 1138 may, for example, be generally subjected to the same processing environment as the substrate 1122, whereas the lower edge rings 1140a/b/c may generally be shielded from the processing environment. Due to the increased exposure of the upper edge ring 1138, the upper edge ring 1138 may have a limited lifespan and may require more frequent replacement or cleaning as compared with the lower edge rings 1140a/b/c.

The apparatus 1100 may also include a system for removing process gases from the process chamber 1102 during and after processing concludes. For example, the process chamber 1102 may include an annular plenum 1156 that encircles the wafer support column 1144. The annular plenum 1156 may, in turn, be fluidically connected with a vacuum foreline 1152 that may be connected with a vacuum pump, e.g., such as may be located beneath a subfloor below the apparatus 1100. A regulator valve 1154 may be provided in between the vacuum foreline 1152 and the process chamber 1102 and actuated to control the flow into the vacuum foreline 1152. In some implementations, a baffle 1150, e.g., an annular plate or other structure that may serve to make the flow into the annular plenum 1156 more evenly distributed about the circumference of the wafer support column 1144, may be provided to reduce the chances of flow non-uniformities developing in reactants flowed across the substrate 1122.

The showerhead 1110, as shown, is a dual-plenum showerhead 1110 and includes a first plenum 1112 that is provided process gas via a first inlet 1116 and a second plenum 1114 that is provided process gas via a second inlet 1118. Generally, two plenums can be employed to maintain separation between the precursor(s) and the counter-reactant(s) prior to release of the precursor and the counter-reactant. The showerhead 1110 may, in some implementations, have more than two plenums. In some instances, a single plenum is used to deliver the precursor(s) into the reaction space 1120 of the processing chamber 1102. Each plenum may have a corresponding set of gas distribution ports that fluidically connect the respective plenum with the reaction space 1120 through the faceplate of the showerhead 1110 (the faceplate being the portion of the showerhead 1110 that is interposed between the lowermost plenum and the reaction space 1120).

The first inlet 1116 and the second inlet 1118 of the showerhead 1110 may be provided processing gases via a gas supply system, which may be configured to provide one or more precursor(s) and/or counter-reactant(s), as discussed herein. The depicted apparatus 1100 is configured to provide multiple precursors and multiple counter-reactants. For example, a first valve manifold 1168a may be configured to provide precursor(s) to the first inlet 1116, while a second valve manifold 1168b may be configured to provide other precursor(s) or other counter-reactants to the second inlet 1118.

A first valve manifold 1168a may be configured to provide one or more precursor(s) to the first inlet 1116, while a second valve manifold 1168b may be configured to provide other precursor(s) or other reactant to the second inlet 1118. In this example, the first valve manifold 1168a, for example, includes multiple valves A1-A5. Valve A2 may, for example, be a three-way valve that has one port fluidically connected with a first vaporizer 1172a, another port fluidically connected with a bypass line 1170a, and a third port fluidically connected with a port on another 3-way valve A3. Similarly, valve A4 may be another three-way valve that has one port fluidically connected with a second vaporizer 1172b, another port fluidically connected with the bypass line 1170a, and a third port fluidically connected with a port on another 3-way valve A5. One of the other ports on valve A5 may be fluidically connected with the first inlet 1116 while the remaining port on valve A5 may be fluidically connected with one of the remaining ports on the valve A3. The remaining port on the valve A3 may, in turn, be fluidically connected with the valve A1 which may be fluidically interposed between the valve A3 and a purge gas source 1174, e.g., nitrogen, argon, or other suitably inert gas (with respect to precursor(s) and/or counter-reactant(s)). In some implementations, only the first valve manifold is employed.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

The first valve manifold 1168a may, for example, be controllable to cause vapors from one or both of the vaporizers 1172a and 1172b to be flowed either to the process chamber 1102 or through the first bypass line 1170a and into the vacuum foreline 1152. The first valve manifold 1168a may also be controllable to cause a purge gas to be flowed from the purge gas source 1174 and into the first inlet 1116.

For example, to flow vapor from the first vaporizer 1172a into the reaction space 1120, the valve A2 may be actuated to cause the vapor from the first vaporizer 1172a to first flow into the first bypass line 1170a. This flow may be maintained for a period of time sufficient to allow the flow of the vapor to reach steady state flow conditions. After sufficient time has passed (or after a flow meter, if used, indicates that the flow rate is stable), valves A2, A3, and A5 may be actuated to cause the vapor flow from the first vaporizer 1172a to be directed to the first inlet. Similar operations with valves A4 and A5 may be performed to deliver vapor from the second vaporizer 1172b to the first inlet 1116. In some instances, it may be desirable to purge one of the vapors from the first plenum 1112 by actuating the valves A1, A3, and A5 so as to cause the purge gas from the purge gas source 1174 to be flowed into the first inlet 1116. In some additional implementations, it may be desirable to simultaneously flow vapor from one of the vaporizers 1172a or 1172b in tandem with flowing gas from the purge gas into the first inlet 1116. Such implementations may be used to dilute the concentration of the reactant(s) contained in such vapor(s).

It will be appreciated that the second valve manifold 1168b may be controlled in a similar manner, e.g., by controlling valves B1-B5, to provide vapors from vaporizers 1172c and 1172d to the second inlet 1118 or to the second bypass line 1170b. It will be further appreciated that different manifold arrangements may be utilized as well, including a single unitary manifold that includes valves for controlling flow of the precursor(s), counter-reactant(s), or other reactants to the first inlet 1116 and the second inlet 1118.

As mentioned earlier, some apparatuses 1100 may feature a lesser number of vapor sources, e.g., only two vaporizers 1172, in which case the valve manifold(s) 1168 may be modified to have a lesser number of valves, e.g., only valves A1-A3.]

As discussed above, apparatuses such as apparatus 1100, which may be used to provide for dry deposition of films, may be configured to maintain particular temperature profiles within the process chamber 1102. In particular, such apparatuses 1100 may be configured to maintain the substrate 1122 at a lower temperature, e.g., at least 25° C. to 50° C. lower, than most of the equipment of the apparatus 1100 that comes into direct contact with the precursor(s) and/or counter-reactant(s). Additionally, the temperature of the equipment of the apparatus 1100 that comes into direct contact with the precursor(s) and/or counter-reactant(s) may be kept to an elevated level that is sufficiently high that condensation of the vaporized reactants on the surfaces of such equipment is discouraged. At the same time, the substrate 1122 temperature may be controlled to a level that promotes condensation, or at least deposition, of the reactants on the substrate 1122.

To provide for such temperature control, various heating systems may be included in the apparatus 1100. For example, the process chamber 1102 may have receptacles for receiving cartridge heaters 1158, e.g., for a process chamber 1102 that has a generally cylindrical interior volume but a square or rectangular external shape, vertical holes for receiving cartridge heaters 1158 may be bored into the four corners of the chamber 1102 housing. In some implementations, the showerhead 1110 may be covered with heater blankets 1160, which may be used to apply heat across the exposed upper surface of the showerhead 1110 to keep the showerhead temperature elevated. It may also be beneficial to heat various gas lines that are used to conduct the vaporized reactants from the vaporizers 1172 to the showerhead 1110. For example, resistive heater tape may be wound around such gas lines and used to heat them to an elevated temperature. As shown in FIG. 11A, all of the gas lines that potentially have precursor(s) and/or counter-reactant(s) flowing through them are shown as being heated, including the bypass lines 1170. The only exceptions are the gas lines from the valve manifolds 1168 to the first inlet 1116 and the second inlet 1118, which may be quite short and may be indirectly heated by the showerhead 1110. Of course, even these gas lines may be actively heated, if desired. In some implementations, heaters may be provided proximate to the gate valve 1106 to provide heat to the gate valve as well.

The various operational systems of the apparatus 1100 may be controlled by a controller 1184, which may include one or more processors 1186 and one or more memory devices 1188 that are operatively connected with each other and that are communicatively connected with various systems and subsystems of the apparatus 1100 so as to provide for control functionality for those systems. For example, the controller 1184 may be configured to control the valves A1-A5 and B1-B5, the various heaters 1158, 1160, the vaporizers 1172, the regulator valve 1154, the gate valve 1106, the wafer support z-actuator, and so forth.

Figure 11B:
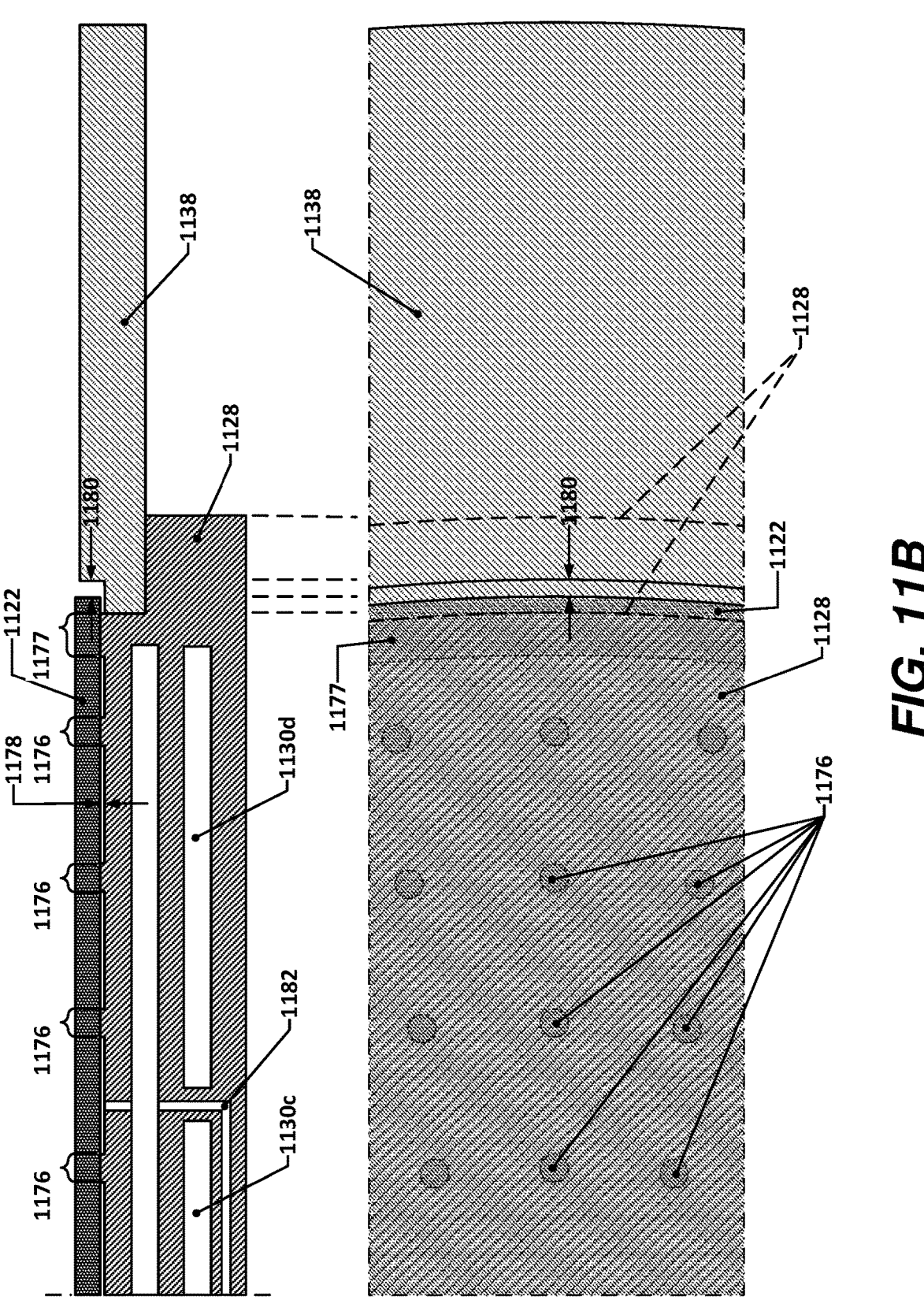
FIG. 11B depicts a detailed side section and plan views of a portion of a top plate, substrate, and edge ring of a dry deposition apparatus according to some implementations.

Another feature that the apparatus 1100 may include is shown in FIG. 11B, which depicts a close-up side cross-sectional and plan views of a portion of the substrate 1122, top plate 1128, and upper edge ring 1138 of FIG. 11A. As can be seen, in some implementations, the substrate 1122 may be elevated off of most of the top plate 1128 by a plurality of small mesas 1176, which may be shallow bosses that protrude from the nominal upper surface of the top plate 1128 by a small distance so as to provide for a backside gap 1178 between the underside of the substrate 1122 and the majority of the top plate 1128. A circumferential wall feature 1177 may be provided at the periphery of the top plate 1128. The circumferential wall feature 1177 may extend around the entire perimeter of the top plate 1128 and be of nominally the same height as the mesas 1176. During processing operations, a generally inert gas, such as helium, may be flowed into the backside gap 1178 via one or more gas ports 1182. This gas may then flow radially outward before encountering the circumferential wall feature 1177, which way then restrict such radially outward flow and cause a higher-pressure region of the gas to be trapped between the substrate 1122 and the top plate 1128. The inert gas that leaks past the circumferential wall 1177 may eventually flow out through a radial gap 1180 between the outer edge of the substrate 1122 and a portion of the upper edge ring 1138. Such gas may serve to protect the underside of the substrate from undesirably being affected by the processing operations being performed by acting to prevent the gases released by the showerhead 1110 from reaching the underside of the substrate 1122. At the same time, the gas released into the backside gap 1178 region may also act to increase thermal coupling between the substrate 1122 and the top plate 1128, thereby allowing the top plate 1128 to more effectively heat or cool the substrate 1122. Due to the higher pressure provided by the circumferential wall, the gas that is within the backside gap 1178 region may also be at a higher density than gas in the remainder of the chamber, and may thus provide more effective thermal coupling between the substrate 1122 and the top plate 1128.

The controller 1184 may be configured, e.g., via execution of computer-executable instructions, to cause the apparatus 1100 to perform various operations consistent with the disclosure provided above.

Once the metal-containing resist film has been deposited on the substrate 1122, the substrate 1122 may, as noted above, be transferred to one or more subsequent process chambers or tool for additional operations (e.g., any described herein). Further deposition apparatuses are described in International Patent Application No. PCT/US2020/038968, filed Jun. 22, 2020, titled "APPARATUS FOR PHOTORESIST DRY DEPOSITION," which is herein incorporated by reference in its entirety.

Conclusion

Process and apparatus for dry development of metal and/or metal oxide photoresists, for example to form a patterning mask in the context of EUV patterning is disclosed.

It is understood that the examples and implementations described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

The invention claimed is:

1. A method comprising:
providing in a process chamber a photopatterned metal-containing resist on a surface of a semiconductor substrate; and
dry developing the photopatterned metal-containing resist by selectively removing a portion of the photopatterned metal-containing resist by exposure to a development chemistry comprising an organic vapor to form a resist mask, wherein the organic vapor comprises a carboxylic acid.

2. The method of claim 1, wherein the organic vapor comprises trifluoroacetic acid.

3. The method of claim 1, wherein dry developing the photopatterned metal-containing resist comprises reacting the organic vapor with the photopatterned metal-containing resist to form a volatile compound at a temperature less than about 200° C.

4. The method of claim 1, wherein dry developing the photopatterned metal-containing resist comprises exposure to at least the organic vapor in a plasma-free thermal process.

5. The method of claim 1, wherein the photopatterned metal-containing resist is a photopatterned metal-containing EUV resist, wherein the photopatterned metal-containing EUV resist is an organo-metal oxide or organo-metal-containing film.

6. The method of claim 1, wherein dry developing the photopatterned metal-containing resist comprises selectively removing an EUV-unexposed portion of the photopatterned metal-containing resist relative to an EUV-exposed portion with the development chemistry to form the resist mask.

7. A method comprising:
providing in a process chamber a photopatterned metal-containing resist on a surface of a semiconductor substrate; and
dry developing the photopatterned metal-containing resist by selectively removing a portion of the photopatterned metal-containing resist by exposure to a development chemistry comprising an organic vapor to form a resist mask, wherein the organic vapor comprises trifluoroacetic acid anhydride, acetic acid anhydride, trichloroacetic acid, mono-fluoroacetic acid, di-fluoroacetic acid, chloro-difluoro-acetic acid, thioacetic acid, or thioglycolic acid.

8. A method comprising:
providing in a process chamber a photopatterned metal-containing resist on a surface of a semiconductor substrate; and
dry developing the photopatterned metal-containing resist by selectively removing a portion of the photopatterned metal-containing resist by exposure to a development chemistry comprising an organic vapor to form a resist mask, wherein the organic vapor comprises hexafluoro-acetylacetone.

9. A method comprising:
providing in a process chamber a photopatterned metal-containing resist on a surface of a semiconductor substrate; and
dry developing the photopatterned metal-containing resist by selectively removing a portion of the photopatterned metal-containing resist by exposure to a development chemistry comprising an organic vapor to form a resist mask, wherein the development chemistry comprises a mixture in a vapor phase of a halogenated carboxylic acid and a hydrogen halide.

* * * * *